United States Patent
Shum et al.

(10) Patent No.: US 9,257,554 B2
(45) Date of Patent: Feb. 9, 2016

(54) SPLIT GATE EMBEDDED MEMORY TECHNOLOGY AND METHOD OF MANUFACTURING THEREOF

(71) Applicant: GLOBALFOUNDRIES Singapore Pte. Ltd., Singapore (SG)

(72) Inventors: Danny Shum, Poughkeepsie, NY (US); Fook Hong Lee, Singapore (SG); Yung Fu Alfred Chong, Singapore (SG)

(73) Assignee: GLOBALFOUNDRIES Singapore Pte. Ltd., Singapore (SG)

( * ) Notice: Subject to any disclaimer, the term of this patent is extended or adjusted under 35 U.S.C. 154(b) by 0 days.

(21) Appl. No.: 14/458,265

(22) Filed: Aug. 13, 2014

(65) Prior Publication Data

US 2015/0048439 A1    Feb. 19, 2015

Related U.S. Application Data

(60) Provisional application No. 61/865,143, filed on Aug. 13, 2013.

(51) Int. Cl.

| | | |
|---|---|---|
| *H01L 21/8247* | (2006.01) | |
| *H01L 29/78* | (2006.01) | |
| *G11C 16/00* | (2006.01) | |
| *H01L 29/423* | (2006.01) | |
| *H01L 29/66* | (2006.01) | |
| *H01L 29/792* | (2006.01) | |
| *H01L 27/115* | (2006.01) | |

(52) U.S. Cl.
CPC ............ *H01L 29/7831* (2013.01); *G11C 16/00* (2013.01); *H01L 27/11568* (2013.01); *H01L 29/42344* (2013.01); *H01L 29/66833* (2013.01); *H01L 29/7816* (2013.01); *H01L 29/792* (2013.01)

(58) Field of Classification Search
CPC ...................... H01L 27/11563; H01L 29/7831; H01L 29/7816; H01L 29/66833; H01L 29/792; H01L 27/11568; H01L 29/42344
See application file for complete search history.

(56) References Cited

U.S. PATENT DOCUMENTS

| | | | | |
|---|---|---|---|---|
| 5,930,631 | A * | 7/1999 | Wang et al. | 438/286 |
| 6,037,266 | A * | 3/2000 | Tao et al. | 438/719 |
| 6,218,246 | B1 * | 4/2001 | Kwon | 438/267 |

OTHER PUBLICATIONS

K. Ramkumar et al., A Scalable, Low Voltage, Low Cost SONOS Memory Technology for Embedded NVM Applications, SONOS, 4 pages, 2013.
D. Shum et al., Highly Reliable Flash Memory with Self-aligned Split-gate Cell Embedded into High Performance 65nm CMOS for Automotive & Smartcard Applications, 4 pages, 2012.

(Continued)

*Primary Examiner* — Richard Booth
(74) *Attorney, Agent, or Firm* — Horizon IP Pte. Ltd.

(57) ABSTRACT

Semiconductor devices and methods for forming a semiconductor device are disclosed. The method includes providing a substrate prepared with a memory cell region. A first gate structure is formed on the memory cell region. An isolation layer is formed on the substrate and over the first gate structure. A second gate structure is formed adjacent to and separated from the first gate structure by the isolation layer. The first and second gate structures are processed to form at least one split gate structure with first and second adjacent gates. Asymmetrical source and drain regions are provided adjacent to first and second sides of the split gate structure.

21 Claims, 26 Drawing Sheets

(56) References Cited

OTHER PUBLICATIONS

Krishnaswamy Ramkumar et al., Advantages of SONOS memory for embedded flash technology, http://eetimes.com/General/DisplayPrintViewContent?contentItemId=4228564, Sep. 29, 2011.
Takashi Kong et al., 40nm Embedded SG-MONOS Flash Macros for Automotive with 160MHz Random Access for Code and Endurance Over 10M Cycles for Data, ISSCC 2013, Session 12, 12.2, Non-Volatile Memory Solutions, IEEE International Solid-State Circuits Conference.
Kuo-Tung Chang et al., A New SONOS Memory Using Source-Side Injection for Programming, IEEE Electron Device Letters, Jul. 1998, pp. 253-255, vol. 19, No. 7, IEEE.
Sung-Taeg Kang et al., High Performance Nanocrystal Based Embedded Flash Microcontrollers with Exceptional Endurance and Nanocrystal Scaling Capability, 4 pages, 2012.
Wei-Ming Chen et al., A Novel Flash Memory Device with SPlit Gate Source Side Injection and ONO Charge Storage Stack (SPIN), Symposium on VLSI Technology Digest of Technical Papers, 1997, pp. 63 & 64.

* cited by examiner

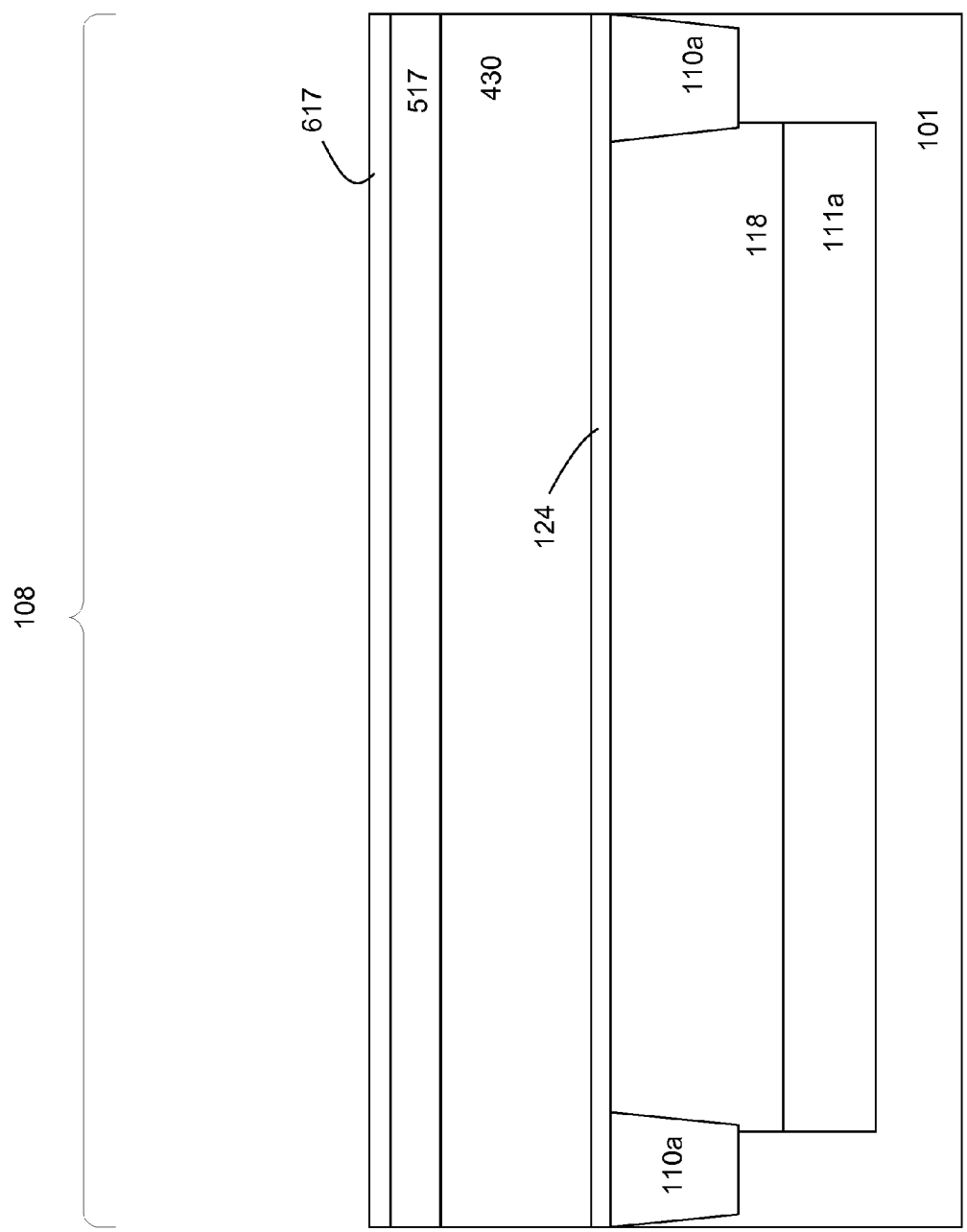

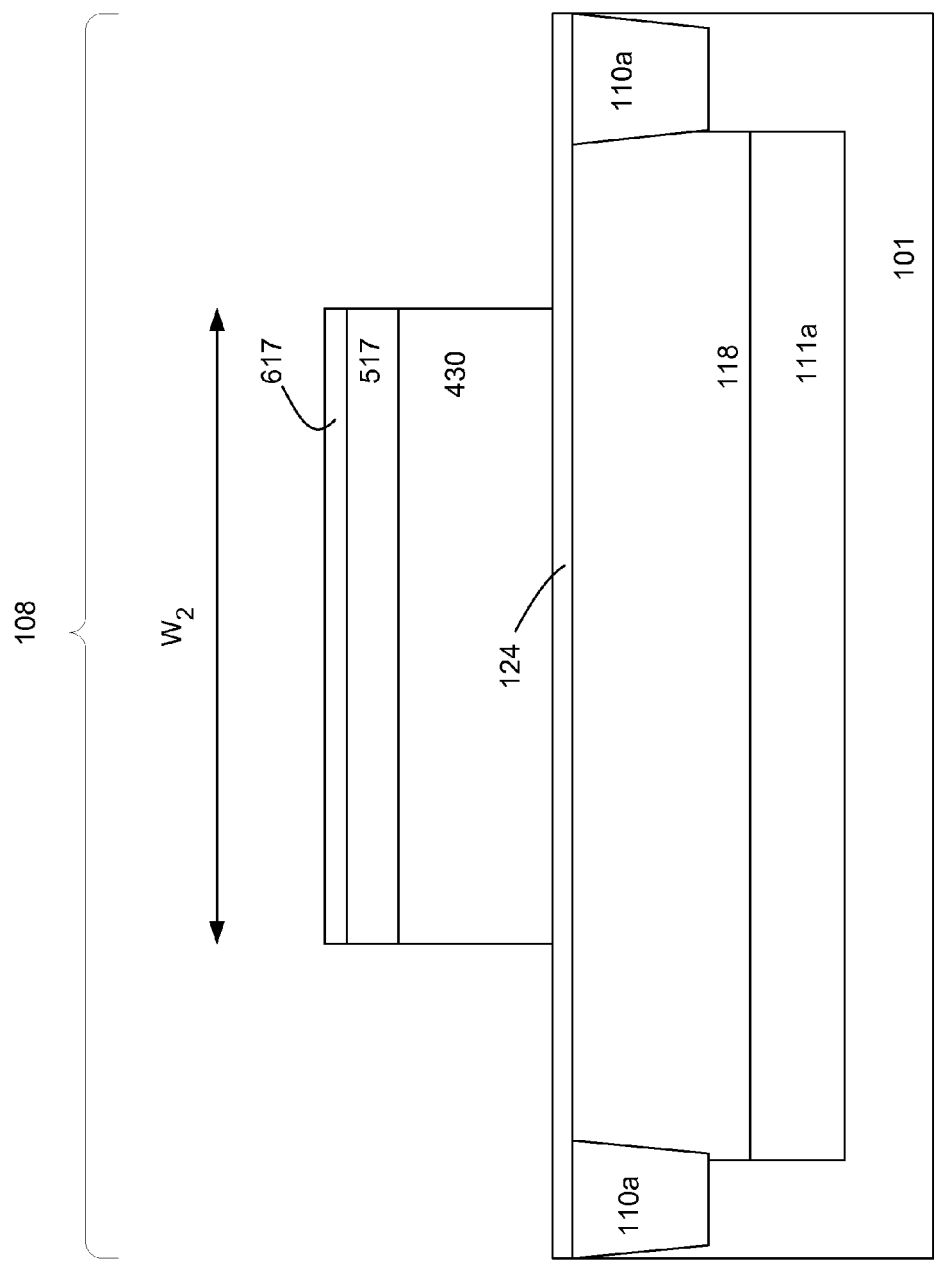

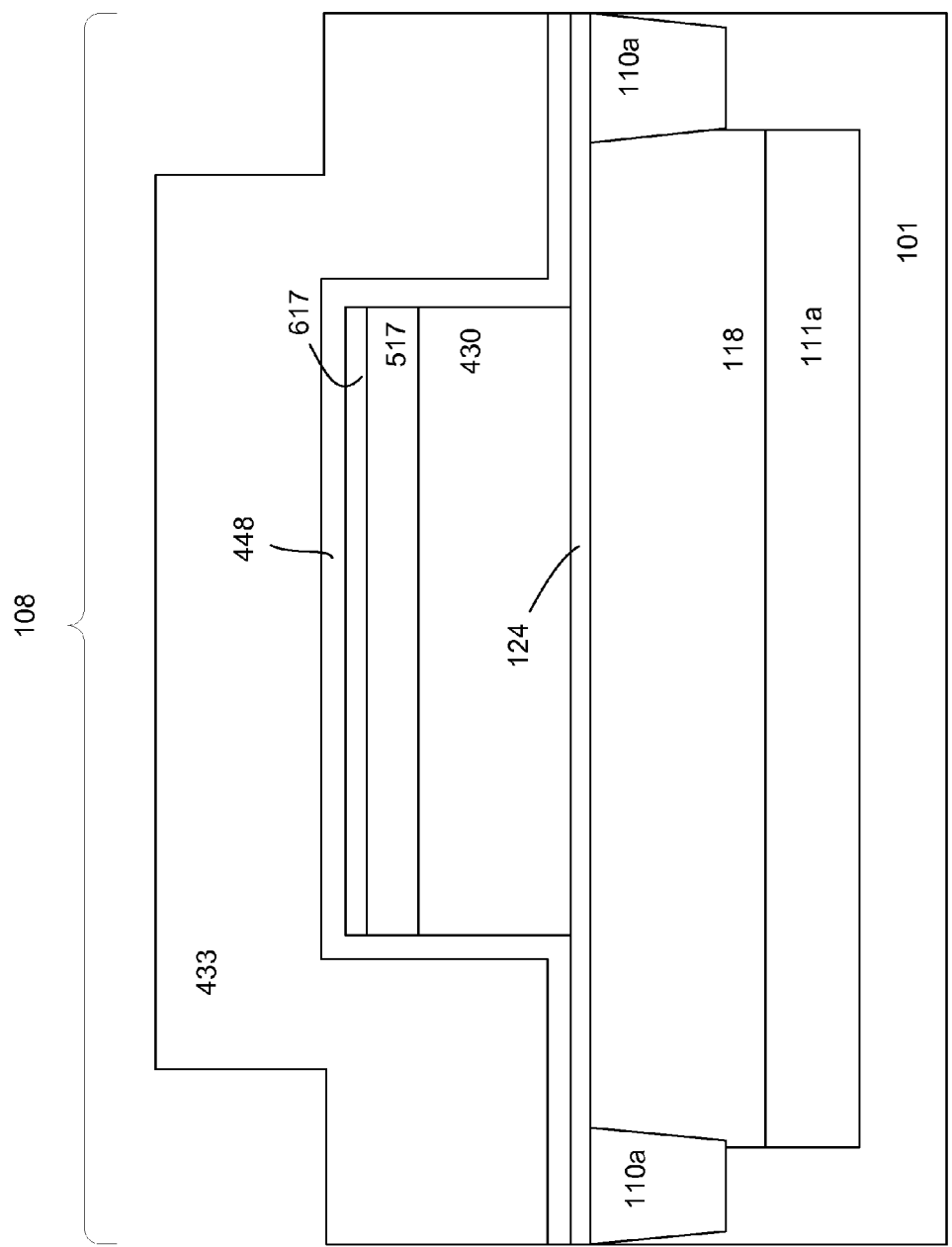

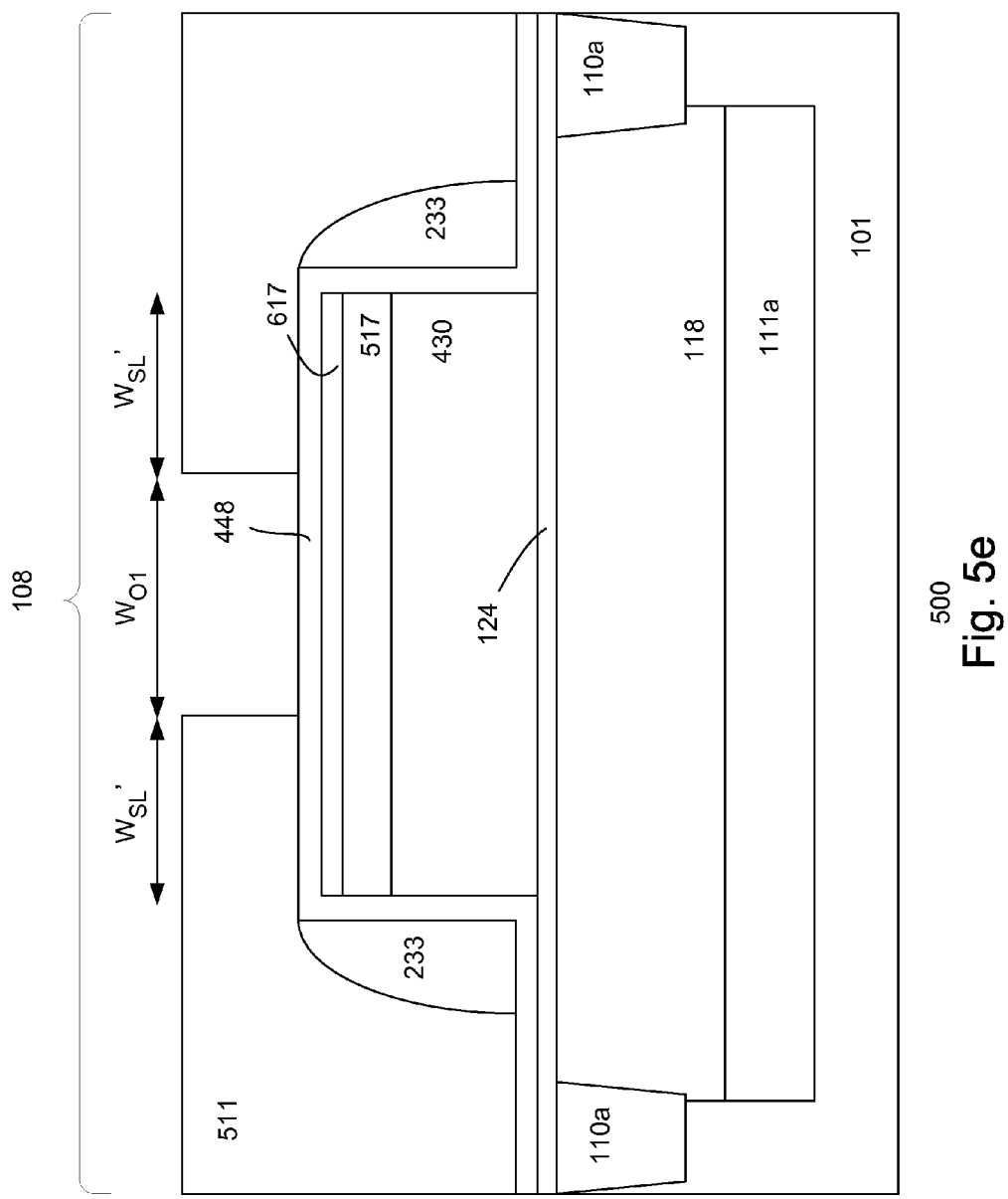

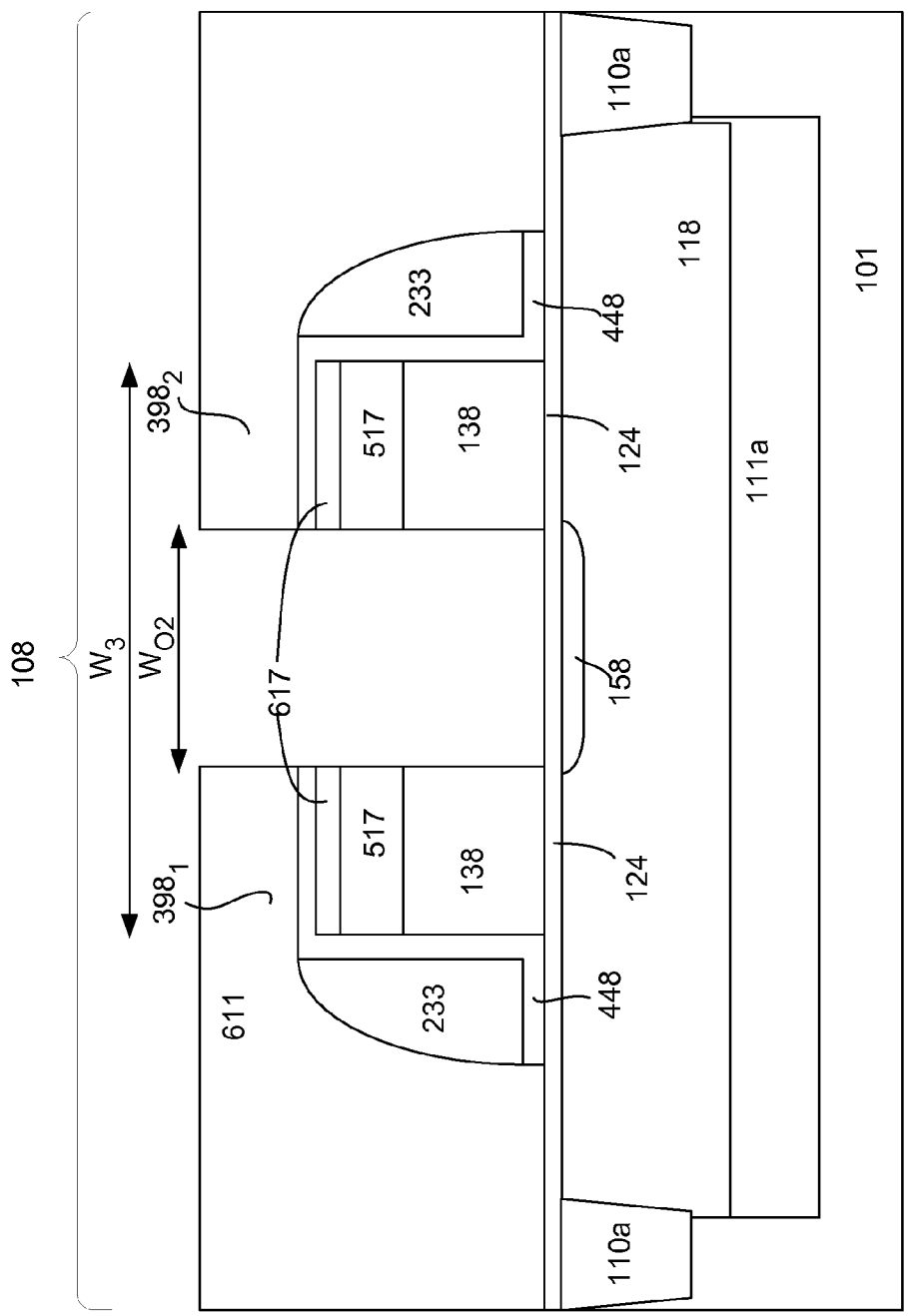

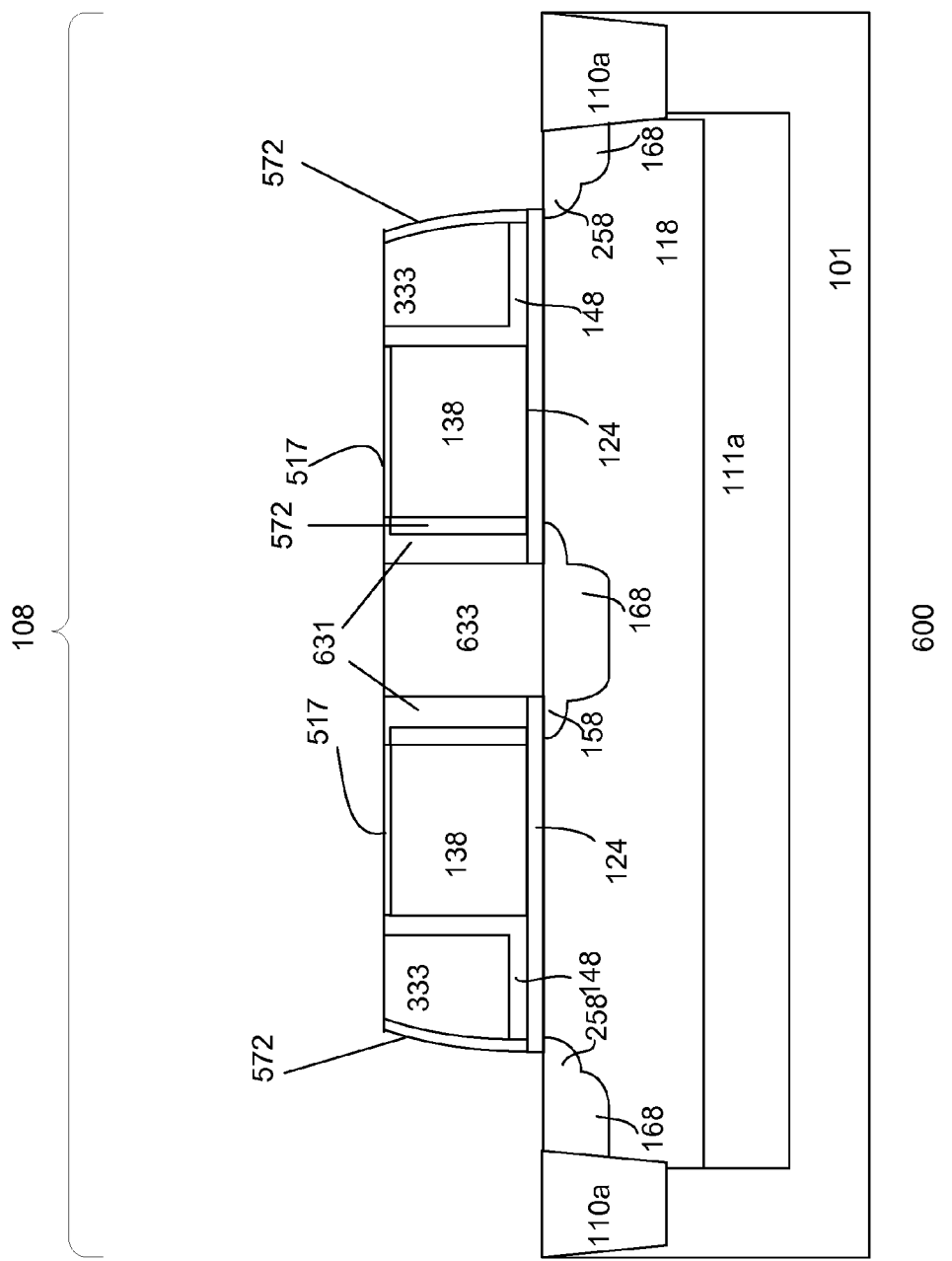

SPLIT GATE EMBEDDED MEMORY TECHNOLOGY AND METHOD OF MANUFACTURING THEREOF

CROSS-REFERENCE TO RELATED APPLICATION

This application claims the priority benefit of U.S. Provisional Application Ser. No. 61/865,143, filed on Aug. 13, 2013, which is herein incorporated by reference in its entirety.

BACKGROUND

Non-volatile memory (NVM) devices are able to retain stored data even when the power supply is interrupted. NVM devices can be programmed using electrical signals. For the embedded memory device to be byte-operational, a two-transistor (2T) cell structure which includes a memory transistor such as silicon-oxide-nitride-oxide-silicon (SONOS) type and a select or access transistor in series can be provided. The memory transistor stores data programmed into the memory cell while the access transistor selects the memory cell to be programmed or erased. However, 2T cell structure requires a lot of space. Split gate NVM devices are proposed to offer a high density solution which requires less space, low cost, re-programmable in system, and highly reliable.

However, the 2T cell structure and current split gate NVM devices suffer several limitations, such as scalability issues or program disturbance. Further, there is also a desire to form split gate memory devices which can be integrated together with other types of devices, such as low voltage (LV), medium voltage (MV) and high voltage (HV) devices, to form embedded memory in a cost effective manner. As such, it is desirable to provide a split gate NVM cell with improved scalability, increased program/erase speed, minimized program disturbance and with improved endurance and a low cost methodology which can integrate logic and memory devices on the same chip.

SUMMARY

Embodiments generally relate to semiconductor devices. In one embodiment, a method for forming a semiconductor device is disclosed. The method includes providing a substrate prepared with a memory cell region. A first gate structure is formed on the memory cell region. An isolation layer is formed on the substrate and over the first gate structure. A second gate structure is formed adjacent to and separated from the first gate structure by the isolation layer. The first and second gate structures are processed to form at least one split gate structure with first and second adjacent gates. Asymmetrical source and drain regions are provided adjacent to first and second sides of the split gate structure.

In another embodiment, a semiconductor device is presented. The device includes a substrate having a memory cell region. A first gate is disposed on the memory cell region. An isolation layer is disposed on the substrate and over the first gate. A second gate is adjacent to and separated from the first gate by the isolation layer and the first and second gates correspond to a split gate structure. The device also includes asymmetrical source and drain regions adjacent to first and second sides of the split gate structure.

These and other advantages and features of the embodiments herein disclosed, will become apparent through reference to the following description and the accompanying drawings. Furthermore, it is to be understood that the features of the various embodiments described herein are not mutually exclusive and can exist in various combinations and permutations.

BRIEF DESCRIPTION OF THE DRAWINGS

In the drawings, like reference characters generally refer to the same parts throughout the different views. Also, the drawings are not necessarily to scale, emphasis instead generally being placed upon illustrating the principles of the invention. Various embodiments of the invention are described with reference to the following drawings, in which:

FIGS. 5a-5g show another embodiment of a process for forming a semiconductor device; and FIGS. 6a-6f show yet another embodiment of a process for forming a semiconductor device.

DETAILED DESCRIPTION

Embodiments generally relate to semiconductor devices and fabricating semiconductor devices. Some embodiments relate to memory devices, such as NVM devices. Such memory devices, for example, can be incorporated into standalone memory devices or easily integrated into logic processing technologies to form integrated circuits (ICs) without compromising the reliabilities of the different devices. Such ICs may be used in, for example, embedded flash technology or other types of technology. The ICs can be incorporated into or used with, for example, microcontrollers for automotive, communication systems, and for consumer products such as cell phones, memory cards, smart cards, internet of things (IOT), etc.

Figure 1A:
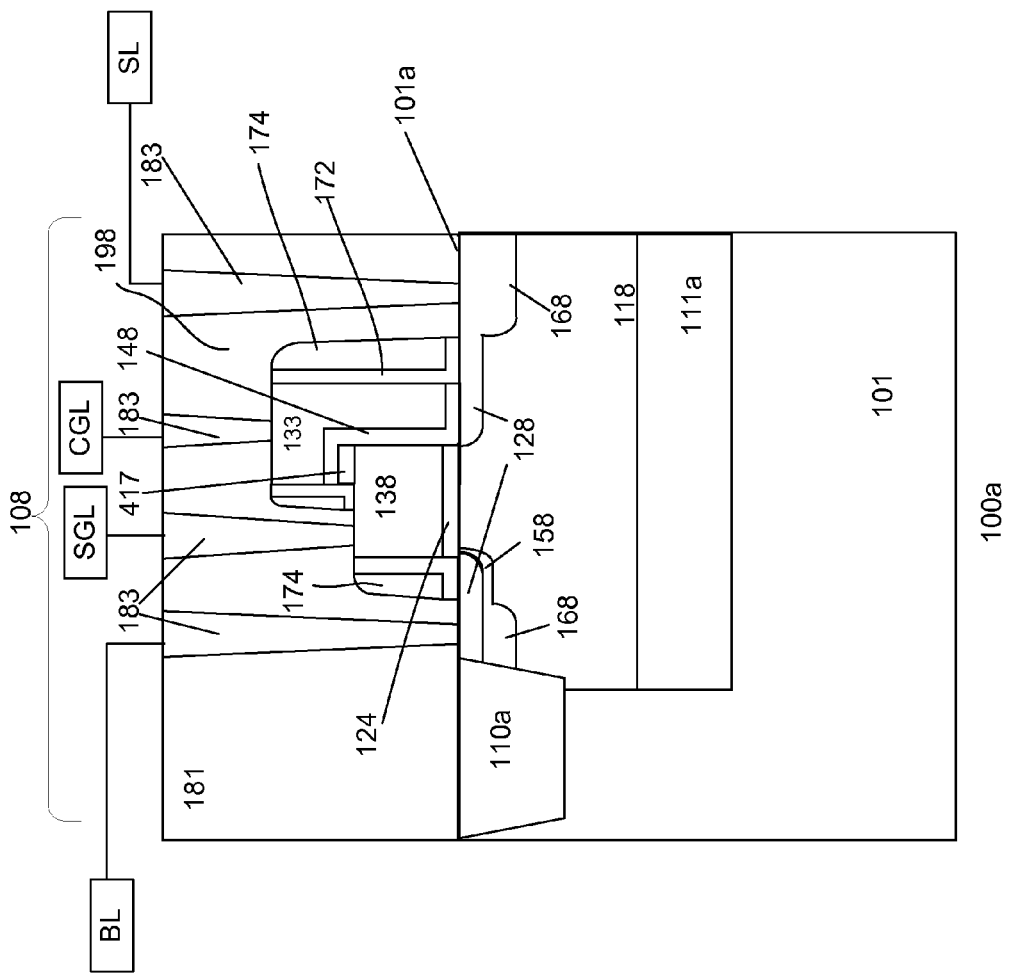
FIG. 1a shows an embodiment of a portion of a device.

FIG. 1a shows an embodiment of a portion 100a of a device. As shown, the portion includes a substrate 101. The substrate includes a semiconductor substrate, such as silicon. Other types of semiconductor substrates, for example, SiGe, SiGeC, SiC, silicon-on-insulators (SOIs), SiGe-on-insulators (SGOIs), are also useful. The substrate, for example, includes a lightly doped substrate. The substrate may be lightly doped with first type dopants. The first type dopants, for example, include p-type dopants, forming a lightly-doped p-type substrate. Providing other types of substrates may also be useful. For example, the substrate may be doped with second type dopants, such as n-type dopants and/or other dopant concentrations, including intrinsically doped substrates.

The substrate can be prepared with a region 108 containing memory cells. In one embodiment, the memory cells include NVM cells. Other types of memory cells are also useful. The region can be referred to as an array region. The array region shows one memory cell 198. Although only one memory cell is shown, it is understood that a plurality of memory cells can be included in the device. The array region can be arranged to have sub-regions corresponding to, for example, groups of memory cells. The array region includes heavily doped well 118 or wells with dopants of a first polarity type. In one embodiment, the doped well 118 includes dopant concentration of about 1E16-1E17 cm$^{-3}$. Other dopant concentration may also be useful. The first polarity type wells are used for second polarity type memory cells. For example, p-type wells are used for n-type memory cells while n-type wells are used for p-type memory cells. P-type dopants can include boron (B), $BF_2$, indium (In) or a combination thereof while n-type dopants can include phosphorus (P), arsenic (As), antimony (Sb) or a combination thereof. An optional deep well 111a having second polarity type dopants may also be included in the substrate to isolate the doped well 118 from the substrate 101.

Additionally, the substrate may include non-array regions (not shown), such as logic and peripheral regions. The logic and peripheral regions, for example, can include low voltage (LV), medium voltage (MV) and high voltage (HV) regions. For example, the LV region is suitable for 1.2 V LV transistors; the MV region is suitable for 5.0-7.0 V MV transistors while the HV region is suitable for over 15 V HV transistors. Other suitable voltage ranges may also be useful, depending on device requirements. The substrate may also include other regions for other types of circuitry, depending on the type of device or IC applications.

The substrate includes isolation regions 110a to isolate active device regions from other active device regions, as required. The isolation regions, for example, include shallow trench isolation (STI) regions. Other types of isolation regions are also useful.

In one embodiment, the memory cell includes a split gate transistor. The split gate transistor, in one embodiment, includes first and second gates 138 and 133. For example, the first gate 138 can be a select gate and the second gate 133 can be a control gate. In one embodiment, the first and second gates are adjacent gates disposed on the surface of the substrate 101a. The width of the select gate, for example, is about 100 nm, depending on the technology node. Other suitable width dimensions may also be useful. As shown in FIG. 1a, the first and second gates have non-coplanar top surfaces. For example, the control gate 133 can be adjacent to and overlaps the select gate 138. In one embodiment, the control gate is adjacent to and overlaps a portion of the select gate, leaving a portion of the select gate uncovered by the control gate in a non-overlap region. As shown, another portion of the control gate is disposed over the substrate. In one embodiment, the width of the overlap portion of the control gate over the select gate is about 20 nm while the width of the portion of the control gate above the substrate is about 100 nm. Other suitable width dimensions may also be useful.

The split gate transistor includes a first gate dielectric 124. The first gate dielectric 124, for example, serves as the select gate dielectric. The select gate dielectric 124 separates the select gate 138 from the substrate 101. The select gate dielectric, for example, includes silicon oxide. The thickness of the select gate dielectric, for example, is about 125 Å. Other suitable dielectric materials and thickness dimensions for the select gate dielectric may be used as long as it is sufficiently thick and suitable for use for MV application. The select and control gates are isolated from each other and the substrate by an isolation layer 148. The isolation layer, in one embodiment, includes a composite layer stack. In one embodiment, the composite layer stack includes an oxide-nitride-oxide (ONO) stack. In such case, the memory cell is a split-gate SONOS memory cell. The physical thickness of the lower oxide layer, for example, may be about 60 Å, the thickness of the nitride layer, for example, may be about 70 Å while the top or upper oxide layer of the ONO stack includes a thickness of about 60 Å. Other suitable thicknesses may also be useful. The isolation layer may include other suitable isolation material. For example, the middle nitride layer of the ONO stack may be replaced by high-K dielectric materials such as $Al_2O_3$, HbOx, TaOx and others. In one embodiment, the isolation layer 148 may also serve as a charge storage layer.

In one embodiment, the split gate transistor includes a hard mask 417. The hard mask, for example, includes an anti-reflective coating (ARC) layer. The ARC layer, for example, includes silicon rich nitride ARC. Other suitable types of hard mask or ARC layers are also useful. The ARC layer, for example, includes a thickness of about 50 Å. Other thicknesses may also be useful so long as it is sufficiently thick to serve as an etch stop layer as well as to elevate the height of the control gate such that larger spacer can be formed later to avoid shorting between the select and control gates. First and second sidewall spacers 172 and 174 can be provided on sidewalls of the gates. The first sidewall spacers, for example, include oxide while the second sidewall spacers 174 include nitride. Other suitable dielectric materials may also be used. The first sidewall spacers, for example, may be L-shaped sidewall spacers. Other suitable shapes may also be useful. Although first and second sidewall spacers are shown, it is understood that the memory cell may include only the first or second sidewall spacers.

The control gate, for example, may be a gate conductor which serves as a common gate for a row of memory cells. Adjacent memory cells can be configured as mirror gate electrodes which may share a common diffusion region. For example, adjacent memory cells can be configured as mirror gate electrodes which may share a common source region 168. Other configurations or layouts of memory cells are also useful. The gates may also be provided with silicide contacts (not shown).

In one embodiment, the split gate transistor is disposed between first and second terminals. The terminals can include, for example, heavily doped diffusion regions 168. The first terminal 168 adjacent to the select gate, for example, serves as a heavily doped drain region and the second terminal 168 adjacent to the control gate serves as a heavily doped source region. The heavily doped source and drain (S/D) regions, for example, include second polarity type dopants for second polarity type memory cell. The heavily doped S/D regions, for example, include second type dopants, such as n-type dopants, having a dopant concentration of about $10^{19}$-$10^{20}$ atom/$cm^3$ and to a depth of about a few thousand Å from the first substrate surface. Other concentrations or depth dimensions may also be useful. In one embodiment, the heavily doped S/D regions 168 include the same dopants. For example, the heavily doped S/D regions include arsenic (As). The memory cell may also include an extension or lightly doped diffusion (LDD) region 158 which is shallower and extends underneath the spacer adjacent to the edge of the select gate 138. The LDD region 158, for example, includes second type dopants as extension implant such as phosphorus (P) having a dopant concentration of about $10^{17}$ atom/$cm^3$ and to a depth of about 3000-4000 Å from the first substrate surface. In some cases, the LDD region may incorporate low dose of boron (B) as halo implant to suppress short channel effect.

In one embodiment, the memory cell also includes counter doped regions 128. The counter doped regions include dopants which are the same polarity type as the dopants of the lightly doped region 158. The counter doped regions are formed adjacent to the sides of the select gate and under the control gate by blanket implant with no added lithographic mask. In one embodiment, the counter doped regions may be lightly to intermediately doped like the LDD region 158 but with a depth shallower than the LDD region. For example, the counter doped region includes phosphorus (P) having dopant concentration of about $10^{17}$ atoms/$cm^3$ and the depth of the counter doped regions may be about 2000 Å from the substrate surface 101a. Other dopant concentrations and depth dimensions may also be useful. By providing counter doped regions, the memory cell 198 allows asymmetrical S/D regions or junctions to be formed with only the use of a single mask and optimize individual threshold voltage (Vth) for the select gate portion to improve the short channel effect (SCE) and the control gate portion to improve the programming efficiency.

Referring to FIG. 1*a*, an interlevel dielectric (ILD) layer 181 is provided over the substrate. Silicide contacts (not shown) and contacts 183 are provided, coupling the diffusion regions to source lines (SLs), bit lines (BLs), and gate electrodes to select gate lines (SGLs), control gate lines (CGLs). The SGL and the CGL forms a word line (WL) in a row direction while the SL and the BL are disposed in a column direction. The silicide contacts, for example, include nickel or cobalt based silicide contacts while the contacts 183 include tungsten contacts. Other suitable materials may also be used. As shown, the drain region 168 is coupled to the BL, the select gate electrode 138 is coupled to the SGL, the control gate electrode 133 is coupled to the CGL while the source region 168 is coupled to the SL.

Figure 1B:
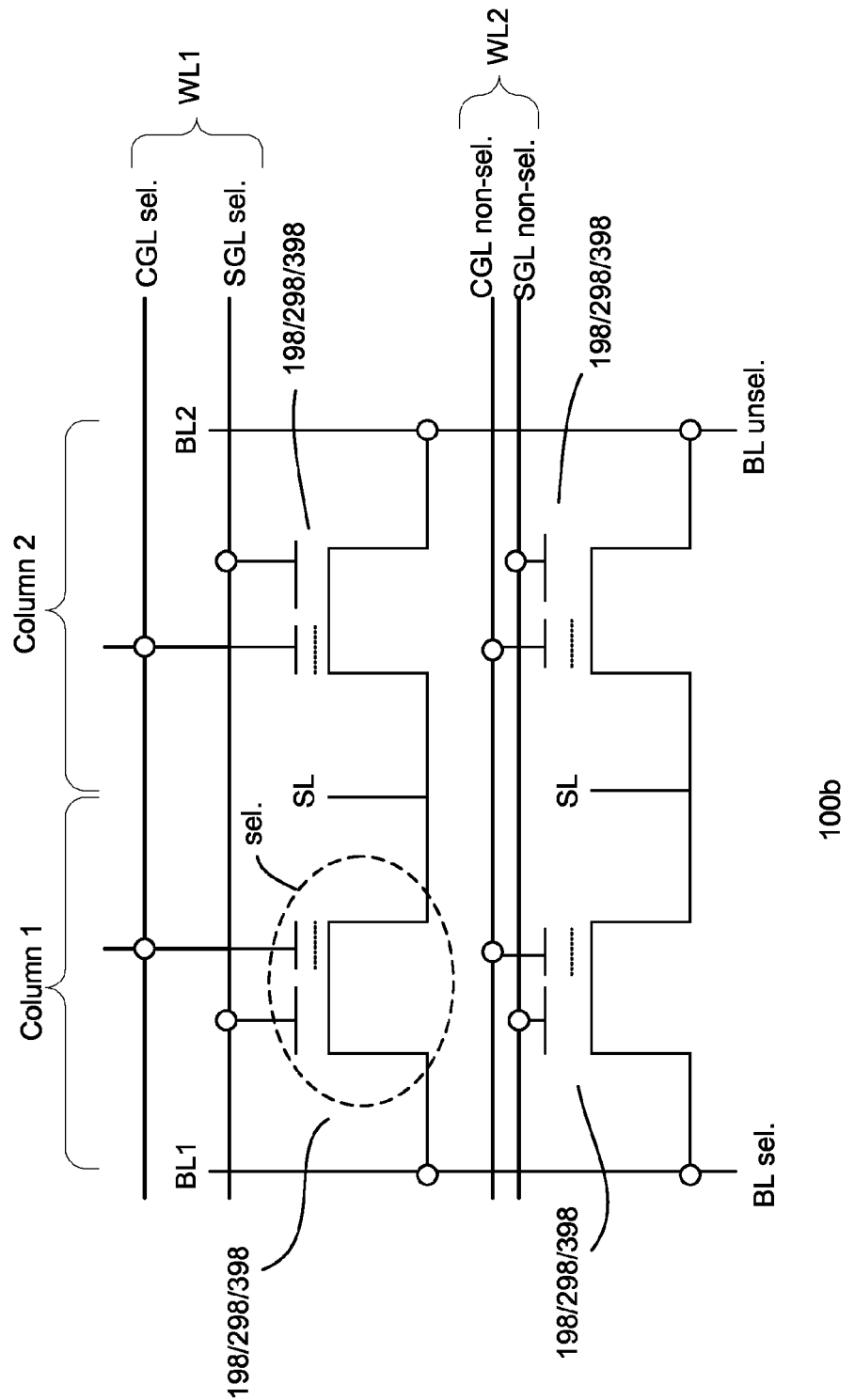
FIGS. 1b-1c show various embodiments of a memory array.

FIG. 1*b* shows an embodiment of a memory array 100*b*. In one embodiment, the memory array includes a NVM array. The memory array includes a plurality of memory cells arranged in rows and columns. The memory cells, for example, include memory cells 198 as described in FIG. 1*a*. A row corresponds to, for example, a SGL and a CGL which also serve as a wordline (WL) and a column corresponds to a bitline (BL) of the array. In one embodiment, the BLs are coupled to the drain regions adjacent to the select gates while WLs are coupled to the select gate and control gates of the memory cells. For example, WLs provide VCG, SGLs may be used to provide VSG to the select gates of the memory cells and BLs provide VD. Source lines (SLs) may not be common to the cells of different sectors. The SLs may be employed to provide Vs to the source regions adjacent to the control gates. SLs and SGLs may be coupled to the memory cells as desired. The memory cells may be configured in a NOR type array architecture within a sector. The configuration as shown in FIG. 1*b*, for example, allows for standard or drain sensing with common source within a sector and different source bias across sectors. Such configuration has its benefits, such as reducing the gate disturbed cells during program operation when drain or bit line inhibit voltages are applied for all unselected (unsel.) BLs in the selected (sel.) sector. The gate disturbed cells are defined as the cells sharing the same selected WLs during program operation. Furthermore, the memory cell will not suffer punch-through issues. A new SLs driver may be required for this configuration.

Figure 1C:
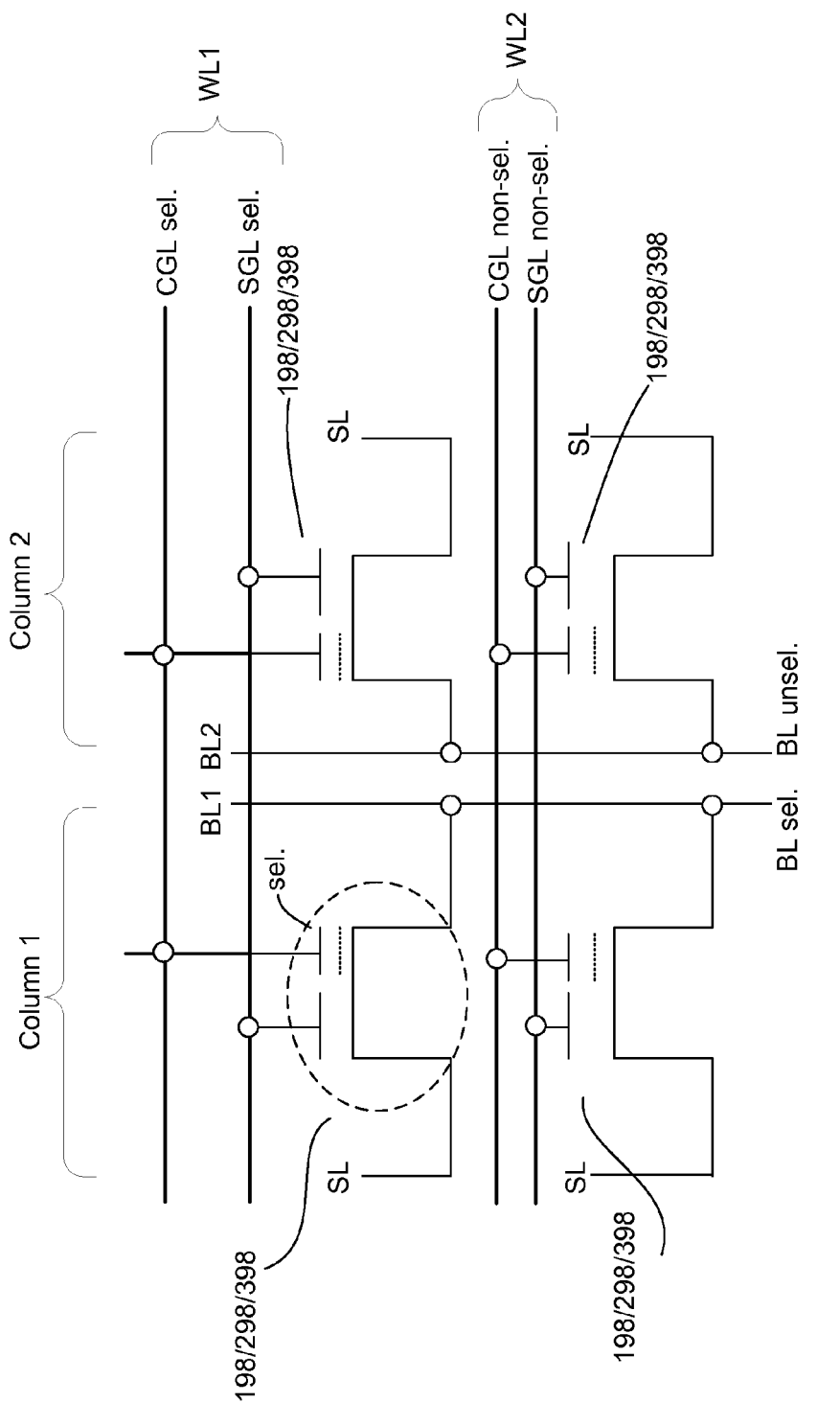

FIG. 1*c* shows another embodiment of a memory array 100*c*. The memory array 100*c* is similar to the memory array 100*b* as described in FIG. 1*b*. In the interest of brevity, common elements with the same reference numerals may not be described or described in detail. In one embodiment, the SLs are coupled to the source region adjacent to the select gate while BLs are coupled to the drain region adjacent to the control gate. The configuration as shown in FIG. 1*c* allows for source sensing in a NOR type array architecture in which source line is common to all sectors. In this configuration, SLs driver is not required, resulting in smaller NVM macro size. Further, this configuration provides improved memory cells leakage control when unselected CGLs bias to some positive voltage values.

A memory cell may be accessed by applying appropriate voltages to the terminals. By applying appropriate voltages to the CGL, SGL, SL and BL, a bit or multiple bits of the memory array may be selected for accessing. A memory access may include a program, read or erase operation. Table 1 below shows various signals applied to the terminals of a memory array of FIG. 1*b* or FIG. 1*c* of selected (sel.) and non-selected (non-sel.) cells for the different memory operations:

| Terminals | Operations | Read | Program | Erase (F-N) tunneling |
|---|---|---|---|---|
| CGL | Sel. | 1.8 V | <9 V | ~10 V |
|  | Non-Sel. | 0 V | 0 V | 0 V |
| SGL | Sel. | 1.8 V | ~1.8 V | 0 V |
|  | Non-Sel. | 0 V | 0 V | 0 V |
| SL | Sel. | 0 V | 4 V | 0 V |
|  | Non-Sel. | 0.5 V | 0 V | 0 V |
| BL | Sel. | 0.5-1 V | 10 μA | 0 V |
|  | Non-Sel. | 0 V | 4 V | 0 V |

The voltage values presented in Table 1 above are exemplary voltage values. It is understood that other suitable types of voltage values may also be useful, depending on the technology node.

The embodiment described in FIG. 1*a* offers several advantages. The memory cell 198 as described is a split gate transistor having a control gate adjacent to the select gate and partially overlapping the select gate, forming a 1.5 transistor (1.5T) cell structure which is smaller than conventional 2T cell structure. Thus, the memory cell 198 requires less cell area relative to conventional 2T cell structure. Unlike conventional SONOS cell which uses Fowler-Nordheim (F-N) tunneling for programming, the memory cell 198 is a split-gate SONOS cell which adopts channel hot electron (CHE) for programming, but with reduced programming current by 10 times by using a technique unique to the 1.5T cell structure such as source-side injection (SSI). For example, a strong electric field near the source side of the device such that high efficient hot electron injection occurs near the source under the high control gate bias but simultaneously limited the channel current which flows between source and drain regions under the weak select gate bias voltage. Thus, the programming time can be reduced to be 10 μs or less which is faster than conventional SONOS cell. Further, since hot electron injection is used for programming which is less dependent on gate oxide, there is no need for an ultra-thin tunnel oxide growing from the silicon substrate. This eliminates the manufacturability problem of traditional SONOS device. Moreover, the erase operation of the memory cell 198 is achieved by tunneling electrons through the top oxide of the ONO stack. Since the thin top oxide is grown from the nitride layer, the self-saturated nature of the top oxide growth makes the thickness control more practical. Moreover, shorter erase time is achieved. Further, as shown, the source region adjacent to the control gate is devoid of LDD region while the drain region adjacent to the drain region includes the LDD region, forming asymmetrical S/D regions. As described, by providing counter doped regions, the memory cell 198 allows the asymmetrical S/D regions or junctions to be formed with only one mask and optimize individual Vth for the select gate portion to improve the short channel effect (SCE) and the control gate portion to improve the programming efficiency.

Figure 2:
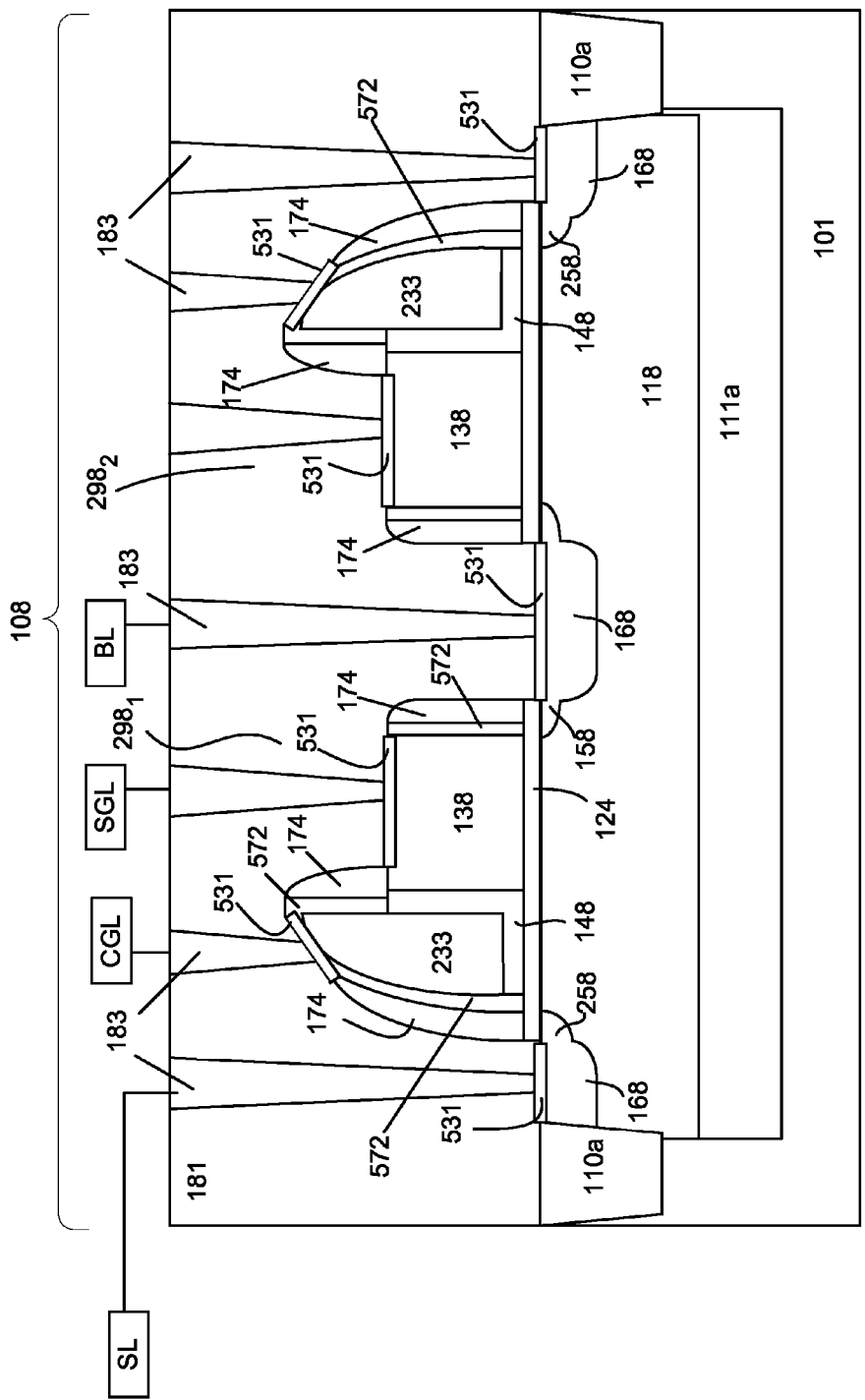
FIGS. 2-3 show various embodiments of a portion of a device.

FIG. 2 shows another embodiment of a portion of a device 200. The portion of the device 200 includes a memory cell pair. For example, the portion of the device 200 includes first and second memory cells 298$_1$ and 298$_2$. Although a memory cell pair is shown, it is understood that the memory cell region may include one or more than two memory cells. The memory cell 298 is similar to the memory cell 198 as described in FIG.

1a. In the interest of brevity, common elements with the same reference numerals may not be described or described in detail.

The memory cell 298 includes a split-gate transistor. The split-gate transistor includes first and second gates 138 and 233. The first gate 138 serves as the select gate and the second gate 233 serves as the control gate. As shown, the control gate 233 is disposed adjacent to the select gate 138 and is separated from each other and the substrate by an isolation layer 148. The split gate transistor is disposed between first and second terminals. The first terminal which is disposed adjacent to the control gate 233, for example, serves as the source region while the second terminal which is disposed adjacent to the select gate 138, for example, serves as the drain region. In one embodiment, the first and second memory cells $298_1$ and $298_2$ share a common second terminal. For example, the first and second memory cells $298_1$ and $298_2$ share a common drain region.

In one embodiment, the S/D regions include asymmetrical S/D regions. The S/D regions, for example, include heavily doped and lightly doped regions. The heavily doped S/D regions 168 as shown in FIG. 2 are identical to the heavily doped S/D regions 168 as shown in FIG. 1a. For example, the heavily doped S/D regions 168 include second type dopants having a dopant concentration of about $10^{19}$-$10^{20}$ atom/cm$^3$ and to a depth of about a few thousand Å from the first substrate surface. Other concentrations or depth dimensions may also be useful. In one embodiment, the lightly doped source region 258 and lightly doped drain region 158 are formed by different dose or energy to produce asymmetrical S/D regions or junctions. For example, low energy and dose such as 30-40 keV and $10^{17}$ atoms/cm$^3$ are employed to form a shallow lightly doped drain region 158 while high energy and dose such as 50-60 keV and $10^{17}$ atoms/cm$^3$ are used to form deeper lightly doped source region 258 to optimize device performance. Other suitable dose and energy parameters may also be useful.

As shown in FIG. 2, the first and second gates have non-coplanar top surfaces. The control gate 233, in one embodiment, differs from the control gate 133 of FIG. 1a. The control gate 233, in one embodiment, is a control gate spacer. The control gate spacer, for example, includes a width which is about sub-critical dimension (sub-CD), depending on, for example, height of the control gate, deposition and reactive ion etch used for forming the control gate spacer. The width of the control gate 233, for example, is about less than 100 nm. Other suitable width dimensions may also be useful. As shown, the control gate 233 is disposed over the substrate adjacent to the select gate 138 but does not overlap the select gate 138. As shown in FIG. 2, sidewall oxide 572 and first and second sidewall spacers 172 (not shown) and 174 can be provided on sidewalls of the gates. The sidewall oxides 572, for example, are formed by thermal oxidation of the select and control gates while the first and second sidewall spacers 172 and 174 are logic sidewall spacers that include oxide and nitride as described in FIG. 1a. The sidewall oxides 572, for example, are formed on exposed select and control gates while the logic sidewall spacers 172 (not shown) and 174 are formed over the sidewall oxides 572.

Referring to FIG. 2, an ILD layer 181 is provided over the substrate. Silicide contacts 531 and contacts 183 are provided, coupling the diffusion regions and gate electrodes to SLs, BLs, SGLs, CGLs or WLs, etc. The silicide contacts 531, for example, include nickel based silicide contacts and the contacts 183, for example, include tungsten. Other suitable types of materials may also be used.

The embodiment as described in FIG. 2 may offer the same or similar advantages as described with respect to the embodiment as described in FIG. 1a. In addition, as described, the control gate 233 is a control gate spacer. This allows the memory cell of FIG. 2 to be shrunk further relative to the memory cell 198 as described in FIG. 1a. The memory cell of FIG. 2 also forms asymmetrical S/D regions. As described, the source and drain regions include same dopants of the second polarity type with different dose and energy. This allows programming to be performed at the source side while read operation to be performed at the drain side. Further, asymmetrical S/D region also enables the select gate length to be shrunk further, enabling a smaller device to be formed.

Figure 3:
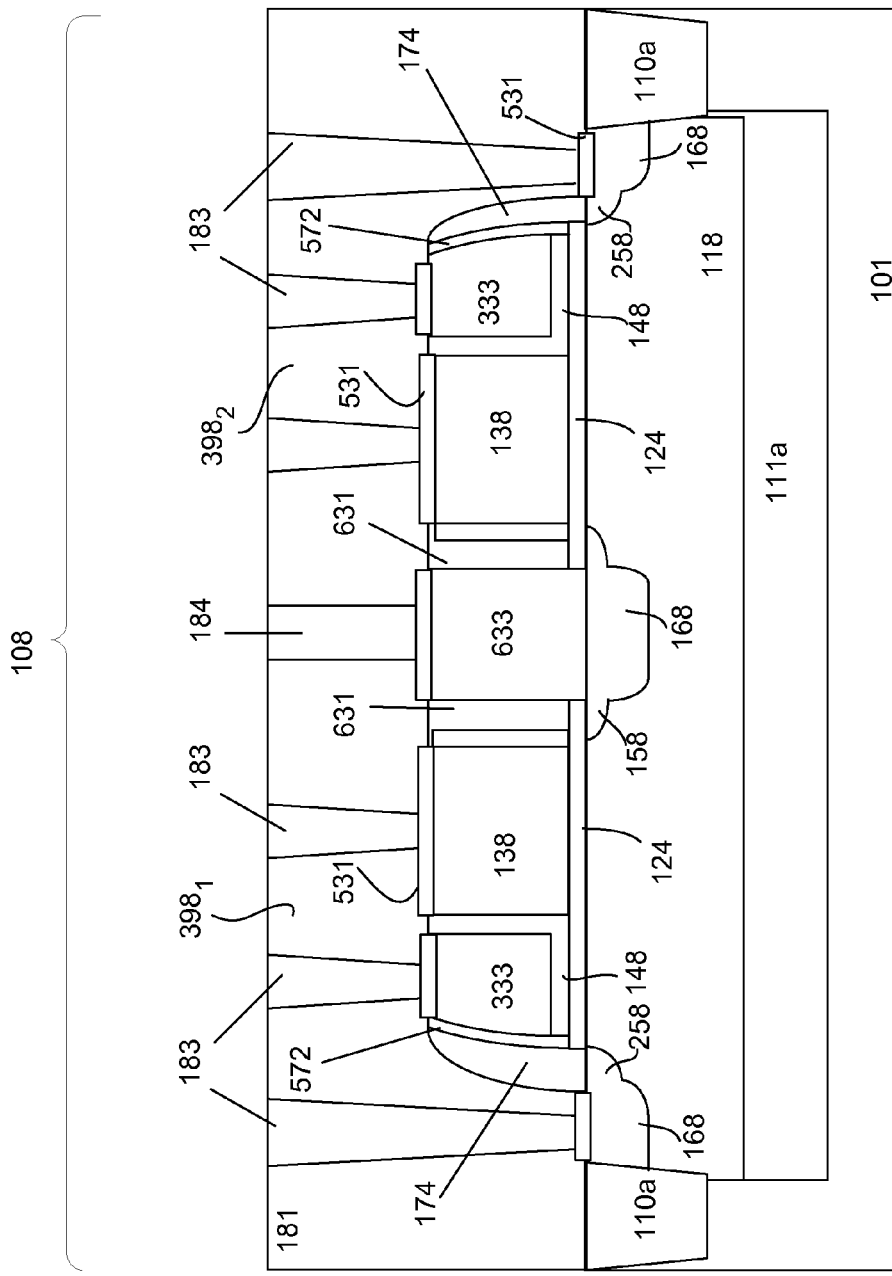

FIG. 3 shows another embodiment of a portion of a device 300. The portion of the device 300 includes a memory cell pair. For example, the portion of the device 300 includes first and second memory cells $398_1$ and $398_2$. Although a memory cell pair is shown, it is understood that the memory cell region may include one or more than two memory cells. The memory cell 398 is similar to the memory cell 198 or 298 as described in FIG. 1a or FIG. 2. In the interest of brevity, common elements with the same reference numerals may not be described or described in detail.

The memory cell 398 includes a split gate transistor. The split gate transistor includes first and second gates 138 and 333. The first gate 138 serves as the select gate and the second gate 333 serves as the control gate. As shown, the control gate 333 is disposed adjacent to the select gate 138 and is separated from each other and the substrate by an isolation layer 148. The split gate transistor is disposed between first and second terminals. The first terminal which is disposed adjacent to the control gate 333, for example, serves as the source region while the second terminal which is disposed adjacent to the select gate 138, for example, serves as the drain region. In one embodiment, the first and second memory cells $398_1$ and $398_2$ share a common second terminal. For example, the first and second memory cells $398_1$ and $398_2$ share a common drain region. Similar to the memory cell 298 of FIG. 2, the memory cell 398 also includes asymmetrical S/D regions. For example, the drain region includes shallow drain region 158 which is formed by different energy and dose than that of the lightly doped source region 258.

The control gate 333, in one embodiment, differs from the control gate 133 of FIG. 1a and control gate 233 of FIG. 2. As shown in FIG. 3, the first and second gates have substantially coplanar top surfaces. The control gate 333, in one embodiment, is a control gate spacer having substantially coplanar top surface with the top surface of the select gate. The control gate spacer 333, for example, includes a width which may be about sub-critical dimension (sub-CD), depending on, for example, height of the control gate, deposition and reactive ion etch used for forming the control gate spacer. The width of the control gate 333, for example, is about 100 nm or less. Other suitable width dimensions may also be useful. As shown, the control gate 333 is disposed over the substrate adjacent to the select gate 138 but does not overlap the select gate 138.

In one embodiment, a contact plug 633 is disposed directly over and coupled to the drain region. In one embodiment, this contact plug 633 is made borderless to the drain region 268 and is self-aligned to the drain region. The contact plug 633, in one embodiment, is a borderless dummy contact plug. The dummy contact plug, for example, includes polysilicon. Other suitable materials may also be used as the contact plug. The size of the contact plug 633, in one embodiment, is less than 2f, where f is the minimum technology node feature size. For example, the width of the borderless contact plug, for example, is at or below 1.5f. In one embodiment, the contact plug 633 is isolated from the select gates 138 by insulator liners 631. In one embodiment, the insulator liners 631 include a dielectric material such as ozone-tetraethoxysilane (ozone-TEOS) or high aspect ratio process (HARP) dielectric material. Other suitable types of dielectric materials may also be used as the insulator liners.

Referring to FIG. 3, an interlevel dielectric (ILD) layer 181 is provided over the substrate. Silicide contacts 531 and contacts 183 are provided, coupling the diffusion regions and gate electrodes to SLs, BLs, SGLs, CGLs or WLs, etc. In addition, unlike the memory cell of FIG. 2, the contact 184 over the drain region 268 of FIG. 3 is indirectly coupled to the drain region 268 through the contact plug 633.

The embodiment as described in FIG. 3 may offer the same or similar advantages as described with respect to the embodiments as described in FIGS. 1a and 2. Additionally, the use of the insulator liners 631 which enables a contact plug 633 to be made borderless and self-aligned to the drain region as shown in FIG. 3 removes 2 times the space (2f; f=minimum technology node feature size) required if contact 183 were made directly to the drain region using lithographic technique as shown in FIG. 2. For example, the borderless contact plug allows the spacing of adjacent select gates to be minimized and not restricted by lithographic limitations. This enables the memory cell to shrink further with about 10-15% reduction in cell size.

The memory cell 298 and 398 may also be used in the memory array configuration as that presented in FIGS. 1b and 1c. Thus, details of the memory array using the memory cell 298 and 398 will not be described or described in detail.

Figure 4A:
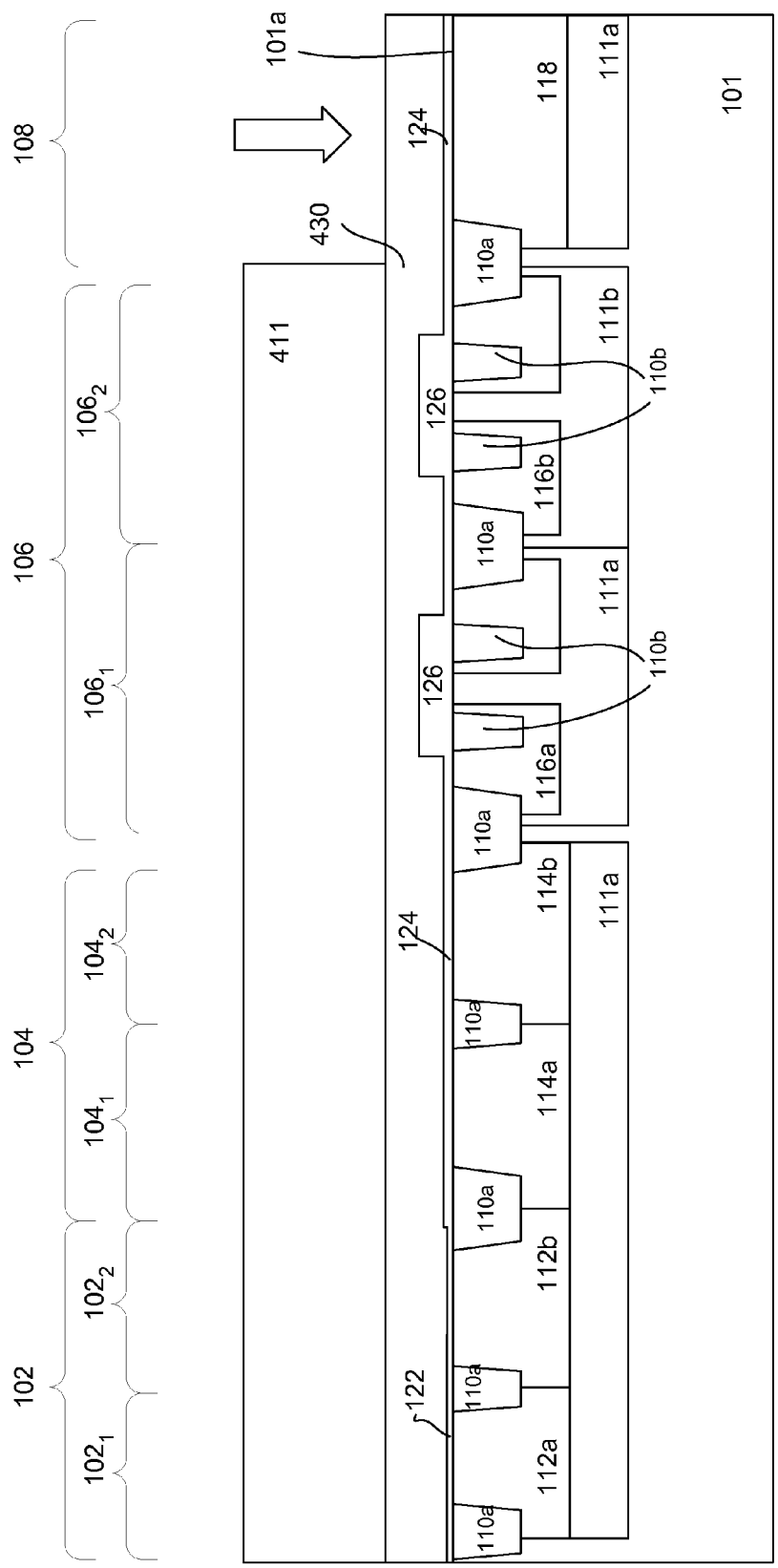
FIGS. 4a-4h show an embodiment of a process for forming a semiconductor device.
Figure 4B:
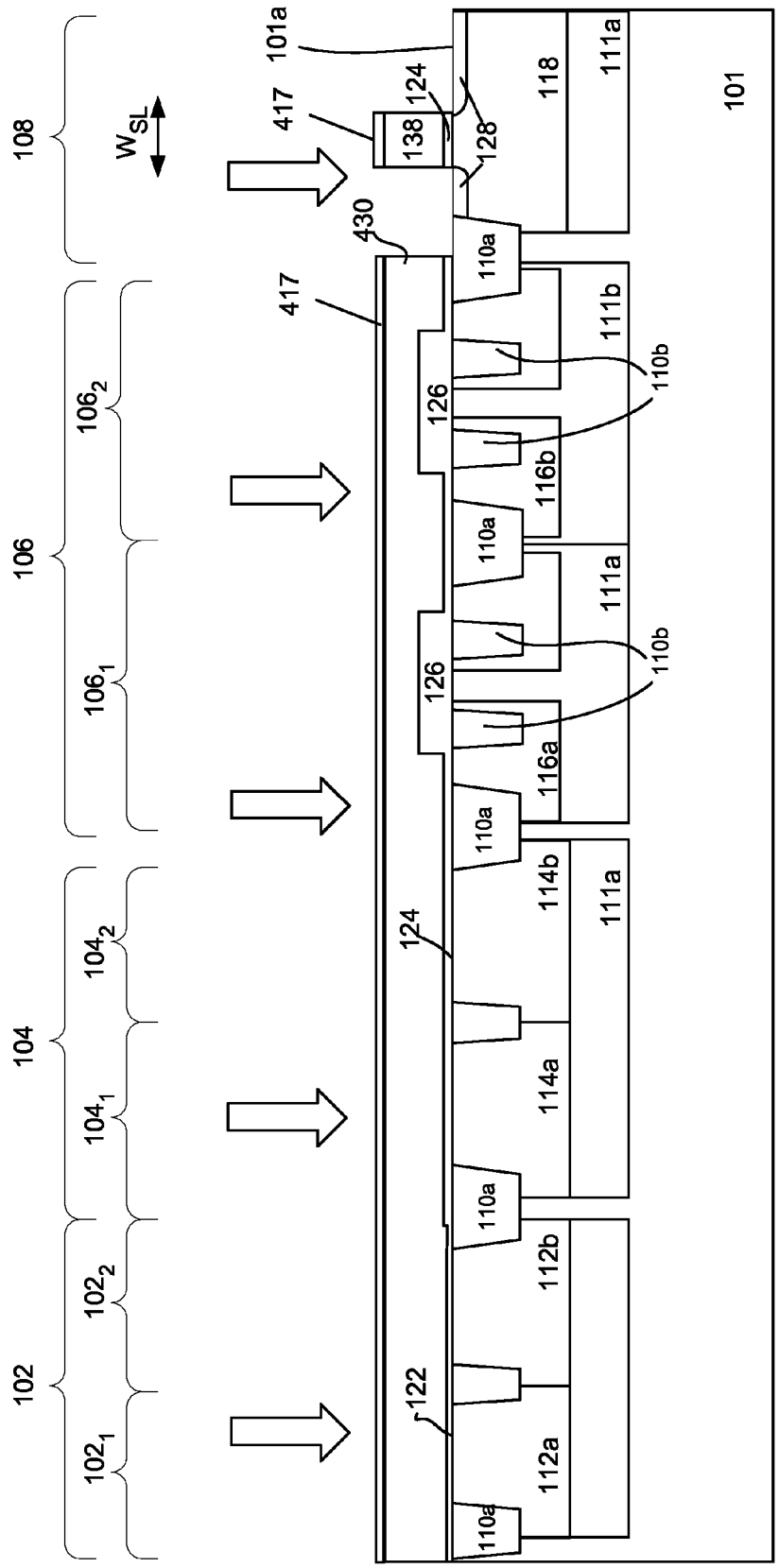
Figure 4C:
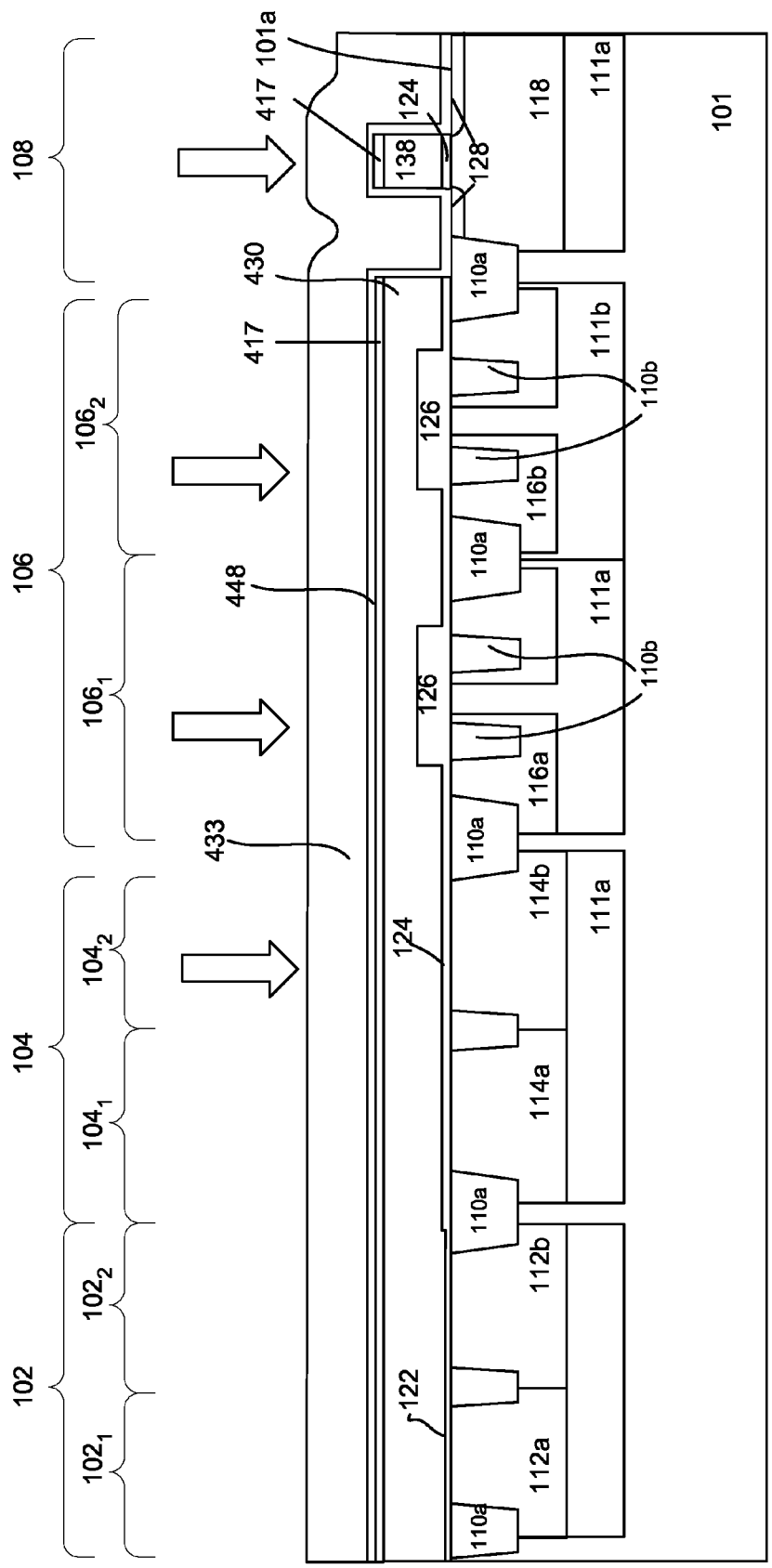
Figure 4D:
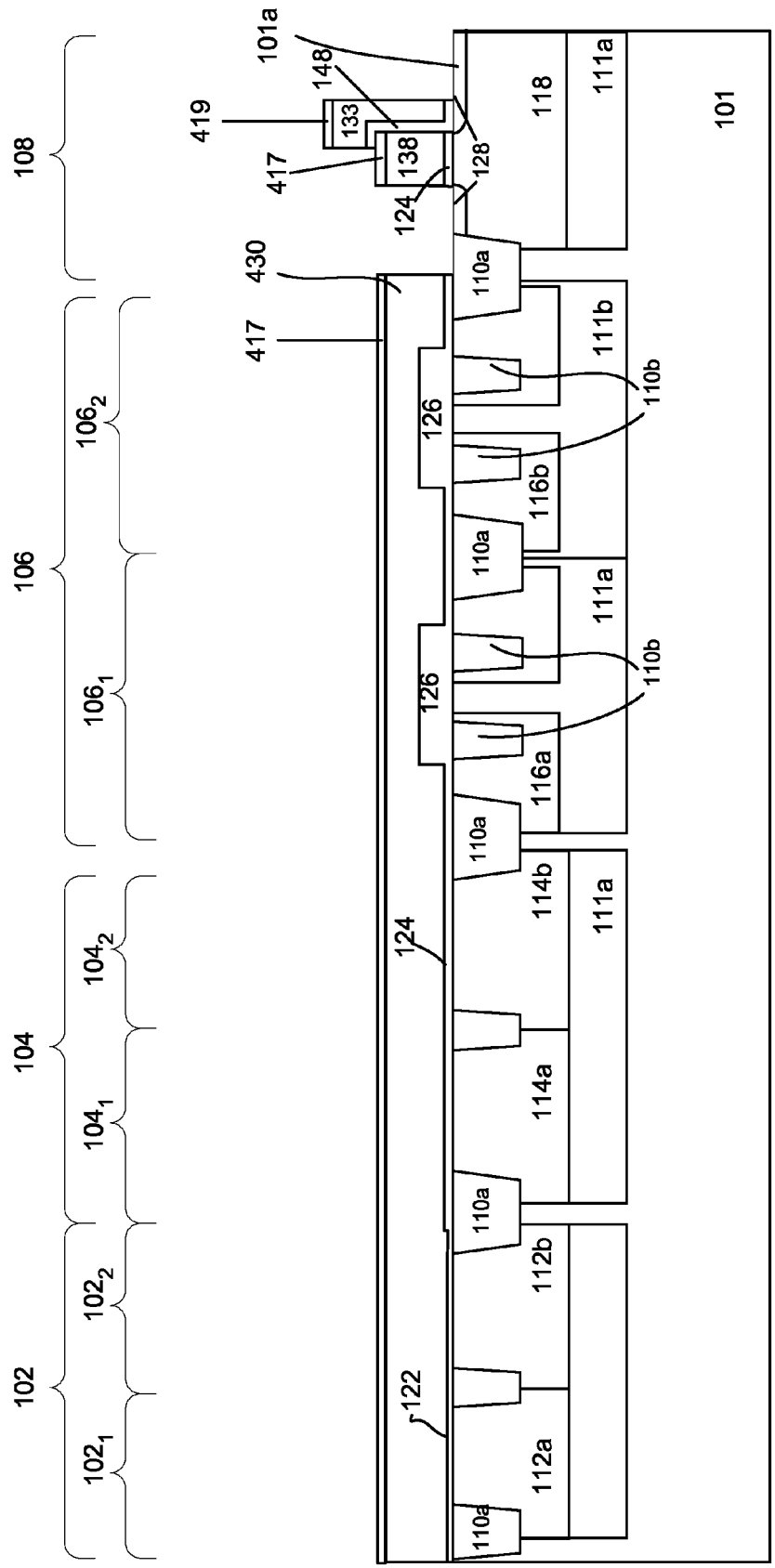
Figure 4E:
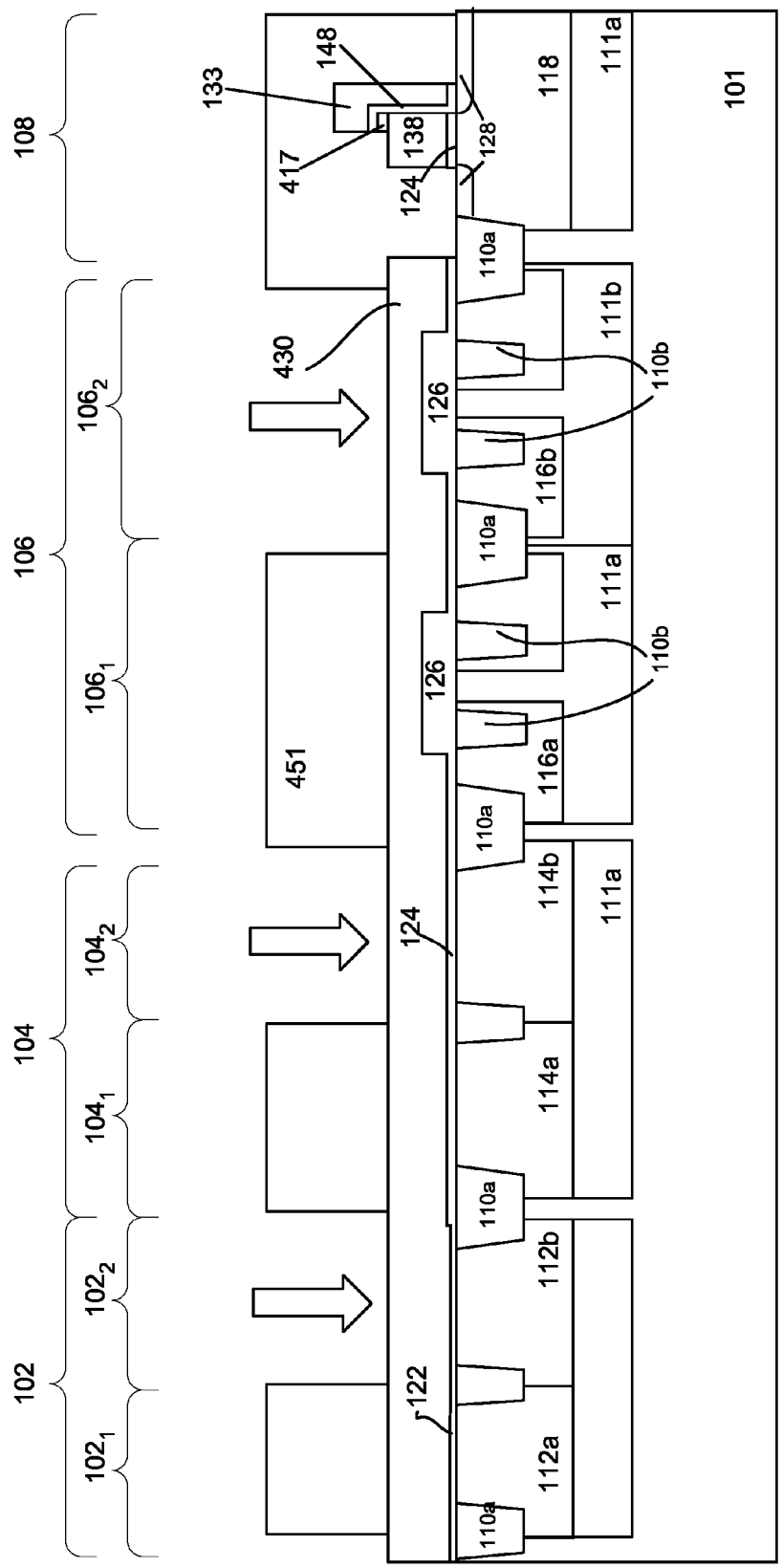

FIGS. 4a-4h illustrate an embodiment of a process 400 for forming a semiconductor device. The process 400 as will be described is highly compatible with complementary metal oxide semiconductor (CMOS) logic processing technology. Referring to FIG. 4a, a substrate 101 is provided. The substrate includes a semiconductor substrate, such as silicon. Other types of semiconductor substrates, for example, SiGe, SiGeC, SiC, silicon-on-insulators (SOIs), SiGe-on-insulators (SGOIs), are also useful. The substrate, for example, includes a lightly doped substrate. The substrate may be lightly doped with first type dopants. The first type dopants, for example, include p-type dopants, forming a lightly-doped p-type substrate. Providing other types of substrates may also be useful. For example, the substrate may be doped with second type dopants, such as n-type dopants and/or other dopant concentrations, including intrinsically doped substrates.

As shown, the substrate is prepared with first, second, third and fourth regions. In one embodiment, the first region 102, for example, includes a low voltage (LV) device region of which LV devices are to be formed. As shown, the first region includes first $102_1$ and second $102_2$ sub-regions. The second region 104, for example, includes a medium voltage (MV) device region of which MV devices are to be formed. Similar to the first region, the second region also includes first $104_1$ and second $104_2$ sub-regions. The third region 106, for example, includes high voltage (HV) device region on which HV devices are to be formed. The third region, as shown, includes first $106_1$ and second $106_2$ sub-regions. The fourth region 108 includes a memory cell region. As shown, the memory cell region is provided on the substrate on which at least one memory cell is to be formed. The memory cell region, for example, is a part of an array region with a plurality of cell regions on which memory cells are formed to create a memory array. Illustratively, the substrate is provided with one LV region, one MV region, one HV region and one memory cell region. The LV, MV and HV regions may collectively be referred to as the logic and peripheral regions. Providing a substrate with other numbers of regions or sub-regions may also be useful.

The substrate is prepared with isolation regions 110, such as shallow trench isolation (STI) regions or deep trench isolation (DTI) regions. First type isolation regions 110a are used for separating the different well regions to provide minimum spacing of any given active regions between adjacent wells. Second type isolation regions 110b, for example, may also be used for separating 2 active regions within the same well with minimum spacing. For example, the second type isolation region may be used to provide isolation of source to drain with the same device when the device is electrically on very high HV gate or drain bias. Various processes can be employed to form the isolation regions. For example, first and second pad layers (not shown) may be provided on top of the substrate. The first pad layer, for example, includes a pad oxide layer while the second pad layer includes a pad nitride layer. The substrate is etched using etch and mask techniques to form trenches which are then filled with dielectric material such as silicon oxide. Excess dielectric material is removed by, for example, chemical mechanical polishing (CMP), producing isolation structures having top surfaces co-planar with the second pad layer. In one embodiment, the first and second pad layers are removed, producing isolation structures having surfaces which are non co-planar with a first substrate surface. Other processes or materials can also be used to form the isolation regions.

The process may continue to form various wells in the substrate. For example, the substrate 101 is implanted with dopants to form deep wells. The substrate, for example, is implanted with second polarity type dopants, such as n-type dopants, in LV and MV regions 102 and 104, first sub-region of the HV region $106_1$ and memory cell region 108 to form second polarity type deep wells 111a while covering the second sub-region $106_2$ of the HV region using a deep well implant mask (not shown). In one embodiment, n-type dopants, such as phosphorus, are implanted into the substrate. The process may also continue to implant first polarity type dopants, such as p-type dopants in the second sub-region $106_2$ of the HV region to form first polarity type deep well 111b while covering the other regions using another deep well implant mask (not shown). In one embodiment, p-type dopants, such as boron, are implanted into the substrate. The deep wells, for example, are implanted with first or second polarity type dopants having a dopant concentration of about $10^{16}$-$10^{18}$ atom/cm$^3$ and to a depth of about 1.5-2.2 μm from the first substrate surface 101a. Providing other types of dopants, concentration and depths using suitable implant masks, dose and energy to form the deep wells may also be useful.

The process also forms a LV well region of the second polarity type 112a, such as n-type, in the first sub-region $102_1$ and a LV well region of the first polarity type 112b, such as p-type, in the second sub-region $102_2$ in the LV region 102. The LV wells, for example, are implanted with first or second polarity type dopants having a dopant concentration of about $10^{15}$-$10^{17}$ atom/cm$^3$ and to a depth of about 0.3-0.4 μm from the first substrate surface 101a. MV well regions are also formed in the MV region 104. For example, a MV well region of the second polarity type 114a, such as n-type, is formed in the first sub-region $104_1$ and a MV well region of the first polarity type 114b, such as p-type, is formed in the second sub-region $104_2$ in the MV region 104. The MV wells, for example, are implanted with first or second polarity type dopants having a dopant concentration of about $10^{16}$-$10^{18}$ atom/cm$^3$ and to a depth of about 0.5-1 μm from the first substrate surface 101*a*. Further, the process also forms HV well regions in the HV region 106. For example, a HV well region of the first polarity type 116*a*, such as p-type, is formed in the first sub-region 106$_1$ and a HV well region of the second polarity type 116*b*, such as n-type, is formed in the second sub-region 106$_2$ in the HV region 106. The HV wells, for example, are implanted with first or second polarity type dopants having a dopant concentration of about $10^{16}$-$10^{18}$ atom/cm$^3$ and to a depth of about 1-1.5 µm from the first substrate surface 101*a*. Providing other types of dopants, concentration and depths using suitable implant masks to form the LV, MV and HV wells may also be useful.

Referring to FIG. 4*a*, a soft mask layer (not shown) is provided over the substrate. The soft mask is patterned to form an opening to expose the memory cell region 108. In one embodiment, the opening corresponds to the opening for a memory cell well implant. For example, the soft mask serves as the memory cell well implant mask. As shown in FIG. 4*a*, the substrate is implanted with first type dopants to form a first type memory cell well 118 for a second polarity type memory cell. For example, p-type dopants, such as boron, are implanted into the substrate to form a p-type memory cell well for a n-type memory cell. The memory cell well, for example, is implanted with p-type dopants having a dopant concentration of about $10^{16}$-$10^{17}$ atom/cm$^3$ and to a depth of about 0.5-1 µm from the first substrate surface. Providing other suitable types of dopants, concentration and depths to form the memory cell well may also be useful.

A first gate dielectric layer 126 is formed over the substrate. In one embodiment, the first gate dielectric layer includes an oxide layer. The oxide layer includes silicon oxide. Other types of dielectric materials may also be used to form the first gate dielectric layer. Alternatively, high-k or low-k or composite dielectric materials may be used. The thickness of the first gate dielectric layer may be about 750 Å. Other suitable thicknesses may also be useful as long as it is sufficiently thick and suitable for use as HV gate dielectric. In one embodiment, the first gate dielectric layer is formed on the entire surface of the substrate. In one embodiment, the first gate dielectric layer is formed by CVD TEOS or furnace high temperature oxide (HTO) deposition. Other suitable techniques may also be used to form the first gate dielectric layer.

The process continues to remove portions of the first gate dielectric layer 126 over the MV and memory cell regions 104 and 108. The portions of the first gate dielectric layer are removed by mask and etch techniques. Removal can be achieved using, for example, an anisotropic etch such as reactive ion etch (RIE). Other suitable removal techniques may also be employed. The process continues to form second gate dielectric layer 124 over the MV and memory cell regions 104 and 108. In one embodiment, the second gate dielectric layer includes an oxide layer. The oxide layer includes silicon oxide. Other types of dielectric materials may also be used to form the second gate dielectric layer. Alternatively, high-k or low-k or composite dielectric materials may be used. The thickness of the second gate dielectric layer may be about 125 Å. Other suitable thicknesses may also be useful as long as it is sufficiently thick and suitable for use as MV gate dielectric. In one embodiment, the second gate dielectric layer is formed by furnace or in-situ steam generated (ISSG) oxidation. Other suitable techniques may also be used to form the second gate dielectric layer. The second gate dielectric layer 124 formed in the MV region serves as gate dielectric for the MV devices to be formed later while the second gate dielectric layer 124 formed in the memory cell region, for example, serves as the select gate dielectric of a select gate which will be described later.

The process continues to remove portion of the first gate dielectric layer over the LV region 102. The portion of the first gate dielectric layer in the LV region is removed by mask and etch techniques. Removal can be achieved using, for example, an anisotropic etch such as RIE. Other suitable removal techniques may also be employed. The process continues to form third gate dielectric layer over the LV region. In one embodiment, the third gate dielectric layer includes an oxide layer. The oxide layer includes silicon oxide. Other types of dielectric materials may also be used to form the third gate dielectric layer. Alternatively, high-k or low-k or composite dielectric materials may be used. The thickness of the third gate dielectric layer may be about 20-30 Å. Other suitable thicknesses may also be useful as long as it is sufficiently thick and suitable for use as LV gate dielectric 122. In one embodiment, the third gate dielectric layer is formed by nitrided oxide. Other suitable techniques may also be used to form the third gate dielectric layer. As shown in FIG. 4*a*, the substrate is prepared with varying gate dielectric thickness over the various regions. The LV region includes the thinnest gate dielectric while the HV region includes the thickest gate dielectric.

The process continues to form a first gate electrode layer 430 on the gate dielectric layers. The first gate electrode layer includes, in one embodiment, polysilicon. Other types of gate electrode materials are also useful. The thickness of the first gate electrode layer, for example, may be about 1000 Å. Other thicknesses are also useful. Various techniques can be used to form the first gate electrode layer. For example, polysilicon can be formed by chemical vapor deposition (CVD). Other techniques, depending on the material, may also be useful.

A mask layer 411, such as a photoresist, is formed on the substrate. The mask layer includes an opening which exposes the memory cell region 108 while covering the other regions. In one embodiment, the exposed portion of the first gate electrode layer in the memory cell region can be implanted or in-situ doped with dopants such as phosphorous to form a doped gate electrode layer. The exposed portion of the first gate electrode layer in the memory cell region, for example, is implanted with phosphorous dopants having a dopant concentration of about $10^{20}$ atom/cm$^3$. Other suitable types of dopants and dopant concentrations may also be useful so long as it prevents poly depletion, reduce resistance and reduces voltage drop.

The process continues to form select gate 138 of the memory cell. A mask layer (not shown), such as a photoresist, is formed on the substrate. A hard mask layer 417, such as an anti-reflective coating (ARC) layer may be provided between the mask and first gate electrode layer. In one embodiment, the ARC layer is a Si-rich ARC layer. Other suitable types of hard mask or ARC layers may also be useful. The mask is patterned as desired to serve as a select gate mask. For example, the mask is patterned to expose portions of the first gate electrode layer in the memory cell region to be removed. The select gate mask protects portions of the first gate electrode layer and hard mask layer over the other regions. As such, the exposed portions of the first gate electrode layer and hard mask layer over the memory cell region are removed. Removal of the exposed portions can be achieved using, for example, RIE. Other techniques may also be useful. The portion of the first gate electrode layer and the hard mask layer protected by the mask layer in the memory cell region remains. The remaining portion of the first gate electrode layer in the memory cell region serves as the select gate electrode 138. The width of the select gate electrode ($W_{SL}$), for example, is about 100 nm, depending on technology node. Other suitable width dimension may also be useful.

The process continues to form counter doped regions 128 in the memory cell region. In one embodiment, the counter doped regions are formed by blanket implanting second polarity type dopants into regions adjacent to sides of the select gate and under the control gate which will be formed later. As shown, the counter doped regions are formed adjacent to sides of the select gate and under the control gate with no added lithographic mask. The counter doped regions include dopants which are the same polarity type as the dopants of the source/drain (S/D) regions which will be formed later. The counter doped regions are formed adjacent to the sides of the select gate within the memory cell well 118 having first polarity type dopants. In one embodiment, the counter doped regions may be a lightly to intermediately doped region. For example, the counter doped regions include dopants such as phosphorus (P) having dopant concentration of about $10^{17}$ atoms/cm$^3$ and the depth of the counter doped regions may be about 2000 Å from the substrate surface 101$a$. Other dopant concentrations and depth dimensions may also be useful. In some embodiments, an anneal may be performed to diffuse the dopants. Other techniques for forming the counter doped regions may also be useful.

The process continues to form an isolation layer 448 over the substrate as shown in FIG. 4$c$. Typically, the isolation layer is formed as a blanket layer on the substrate. The isolation layer, in one embodiment, includes a composite layer stack. In one embodiment, the composite layer stack includes an oxide-nitride-oxide (ONO) stack. Various techniques can be used to form the ONO stack. In one embodiment, a lower oxide layer is first formed. The lower oxide layer can be formed by, for example, high temperature oxidation (HTO). Other techniques including, for example, low pressure CVD (LPCVD) and thermal oxidation are also useful. The physical thickness of the lower oxide layer, for example, may be about 60 Å. Next, a nitride layer is deposited. The thickness of the nitride layer, for example, may be about 70 Å. The nitride layer can be formed by LPCVD. Other techniques are also useful. Finally, the top or upper oxide layer is formed by HTO or reoxidation of nitride. The thickness of the upper oxide layer, for example, may be about 60 Å. The upper oxide layer may be formed using the same techniques as for the lower oxide layer. For example, the isolation layer 448 has a thickness of about 190 Å electrically. Other suitable thicknesses for the various layers and other suitable types of isolation layers may also be useful. For example, the middle nitride layer of the ONO stack may be replaced by high-K dielectric materials such as $Al_2O_3$, HbOx, TaOx and others. The isolation layer, in one embodiment, serves to separate the first gate electrode layer from a second gate electrode layer formed later and to separate the second gate electrode layer from the substrate. Furthermore, the isolation layer which will be patterned later also serves as a charge storage layer for the memory cell.

A second gate electrode layer 433 is formed over the isolation layer and the substrate. The second gate layer, for example, includes a blanket gate layer. In one embodiment, the second gate layer includes polysilicon. The second gate electrode layer can be formed by CVD. The second gate electrode layer may be doped or in-situ doped with dopants such as phosphorus to form a doped polysilicon to impart a higher conductivity to the gate. The polysilicon layer, for example, includes a heavily doped polysilicon layer having phosphorus dopants and a dopant concentration of about $10^{20}$ atom/cm$^3$. The thickness of the second gate electrode layer, for example, may be about 1000 Å. Other materials, dopant concentrations and techniques and thickness ranges may also be useful so long as it prevents poly depletion, reduce resistance and reduces voltage drop. An anneal may be performed after doping the second gate electrode layer.

The process continues to form control gate 133 of the memory cell. Referring to FIG. 4$d$, the second gate electrode layer and the isolation layer beneath it are patterned. For example, a mask layer (not shown) is deposited on top of the second gate layer. A hard mask layer 419, such as an ARC layer may be provided between the mask and second gate electrode layer. In one embodiment, the ARC layer is a Si-rich ARC layer. Other suitable types of hard mask or ARC layers may also be useful. The mask is patterned as desired to serve as a control gate mask. For example, the mask is patterned to expose the second gate electrode layer in the LV, MV and HV regions to be removed. The mask is also patterned to expose portions of the second gate electrode layer in the memory cell region. The exposed second gate layer and the isolation layer beneath it are removed, leaving a portion of the second gate electrode layer 133 and isolation layer 148 in the memory region which forms the control gate as shown in FIG. 4$d$. Removal can be achieved using, for example, RIE. Other techniques may also be useful. As shown, the control gate is adjacent to the select gate and overlaps a portion of the select gate. For example, a portion of the control gate partially overlaps a portion of the select gate, leaving a portion of the select gate uncovered by the control gate while a portion of the control gate is disposed over the substrate. In one embodiment, the width of the overlap portion of the control gate over the select gate is about 10-20 nm while the width of the portion of the control gate above the substrate is about 100 nm. Other suitable width dimensions may also be useful.

The process continues by removing the hard mask layers 417 and 419. In one embodiment, the hard mask layers are removed by RIE. Other suitable techniques may also be used to remove the hard mask layers. The removal of the hard mask layers exposes top surfaces of the first gate electrode layer 430 in the LV, MV and HV regions and the top surface of the control gate and a portion of the top surface of the select gate as shown in FIG. 4$e$. A portion of the hard mask layer 417 remains, overlapping a portion of the select gate and under a portion of the control gate.

Referring to FIG. 4$e$, a soft mask layer 451 is provided over the substrate. The soft mask is patterned to form openings to expose the second sub-regions of the LV, MV and HV regions $102_2$, $104_2$ and $106_2$. In one embodiment, the exposed first gate electrode layer in these sub-regions may be doped with dopants such as phosphorus to form a doped polysilicon. The polysilicon layer, for example, includes a heavily doped polysilicon layer having phosphorus dopants with a dopant concentration of about $10^{20}$ atom/cm$^3$. Other suitable dopants and dopant concentrations may also be useful so long as it prevents poly depletion, reduce resistance and reduces.

Referring to FIG. 4$f$, a mask layer (not shown) is formed on the substrate and patterned. The mask layer is patterned to expose portions of the first gate electrode layer 430 to be removed in the LV, MV and HV regions. The mask layer, for example, protects at least portions corresponding to gates of the LV, MV and HV transistors 132, 134 and 136. For example, the mask serves as a logic and peripheral gate mask. The exposed portions of the first gate electrode layer 430 are removed to form the gate electrodes of LV, MV and HV transistors as shown in FIG. 4$f$. Removal can be achieved using, for example, RIE. The etch is preferably selective to the gate dielectrics. Other techniques may also be useful.

The process continues to form first and second extension or lightly doped diffusion (LDD) regions on the substrate adjacent to the MV gates 134 in the MV region 104. In one embodiment, dopants of the opposite type as the type of the well are implanted. In the case of a first type MV well 114b, the LDD regions 154b include a second type. The LDD regions 154a-154b, for example, are formed using techniques such as ion implantation and implant masks (not shown). For illustration, n-type dopants are implanted to form the LDD regions for a p-type MV well while p-type dopants are implanted to form LDD regions for a n-type MV well. For example, n-type dopants, such as As, P, etc., or a combination thereof, are implanted into p-type MV well. The LDD regions, for example, are implanted with first or second type dopants having a dopant concentration of about $10^{17}$ atom/cm$^3$ and to a depth of about 2000 Å from the first substrate surface. Other concentrations or depth dimensions may also be useful.

Figure 4F:
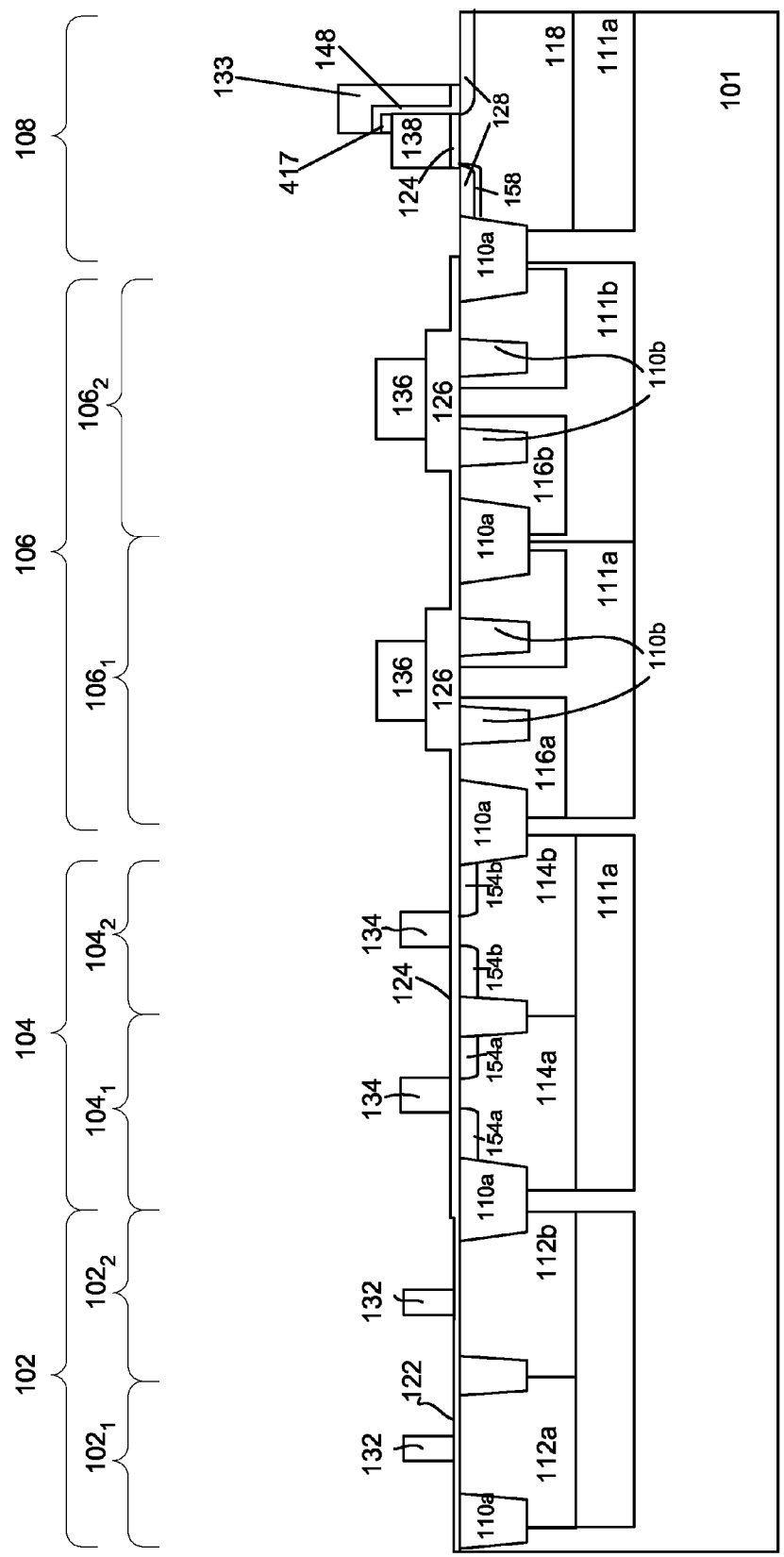

Referring to FIG. 4f, a LDD region 158 is formed in the substrate adjacent to the select gate 138 of the memory cell in the memory cell region 108. In one embodiment, dopants of the opposite type as the type of the memory cell well are implanted. In the case of a first type memory cell well 118, the LDD region 158 includes a second type. The LDD region 158, for example, is formed using techniques such as ion implantation and an implant mask (not shown) which exposes only the substrate region adjacent to the select gate while covering the LV, MV, HV regions and substrate or source region adjacent to the control gate. For example, n-type dopants, such as phosphorus and boron, are implanted into p-type memory cell well. The LDD region 158, for example, is formed by implanting second type dopants having a dopant concentration of about $10^{17}$ atom/cm$^3$ and to a depth of about 3000-4000 Å from the first substrate surface. Other suitable concentrations or depth dimensions may also be useful.

Figure 4G:
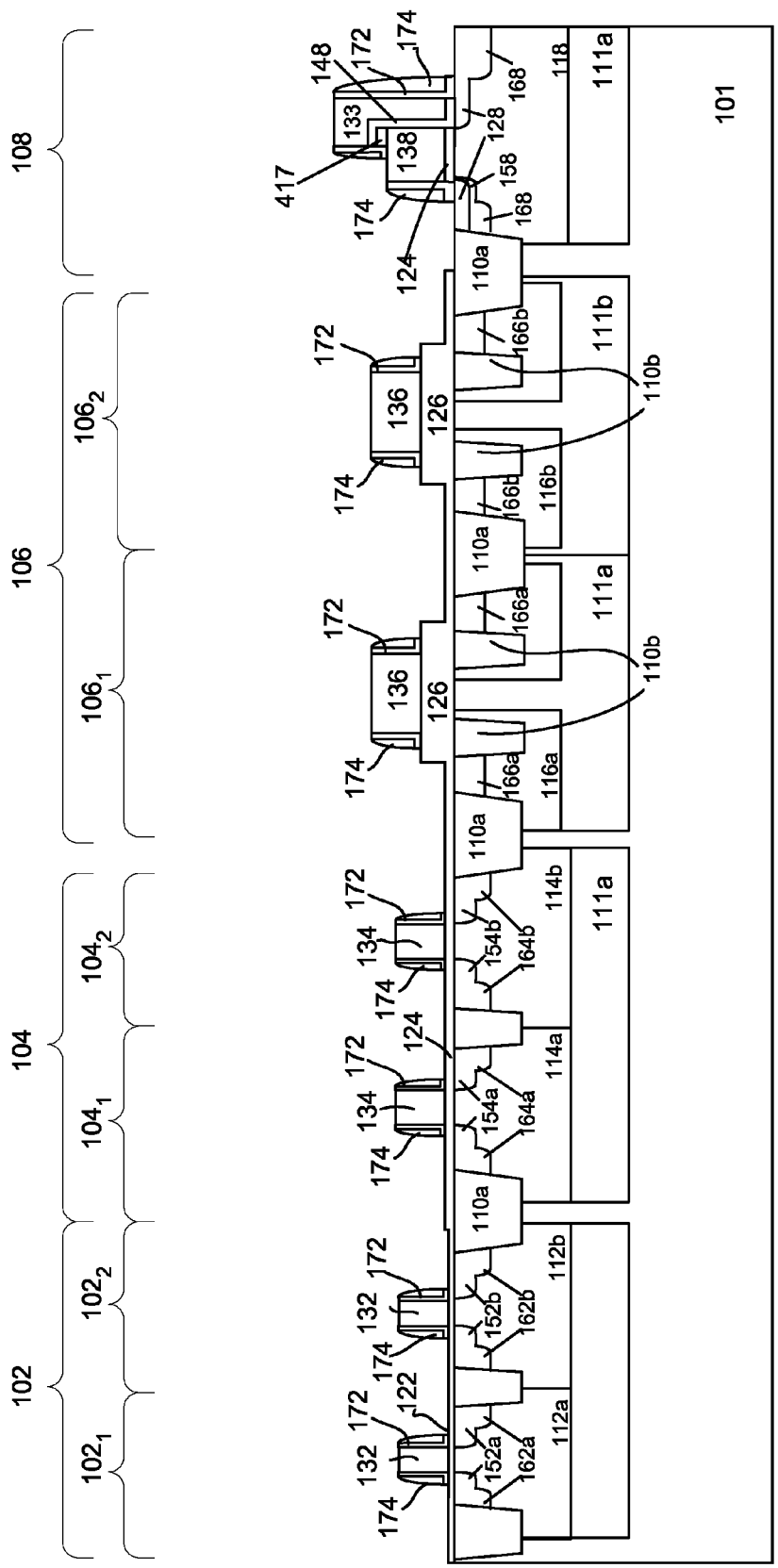

Refer to FIG. 4g, the process continues to form LDD regions 152a-152b on the substrate adjacent to the LV gates 132 in the LV region 102. In one embodiment, dopants of the opposite type as the type of the well are implanted. In the case of a first type LV well 112b, the LDD regions 152b include a second type. The LDD regions 152a-152b, for example, are formed using techniques such as ion implantation and implant masks. For illustration, n-type dopants are implanted to form the LDD regions for a p-type LV well while p-type dopants are implanted to form LDD regions for a n-type LV well. For example, n-type dopants, such as As, P, etc., or a combination thereof, are implanted into p-type LV well. The LDD regions, for example, are implanted with first or second type dopants having a dopant concentration of about $10^{17}$ atom/cm$^3$ and to a depth of about 2000 Å from the first substrate surface. Other suitable concentrations or depth dimensions may also be useful.

The process continues to form first and second spacer elements on sidewalls of the gates. Referring to FIG. 4g, a first spacer layer is formed over the gates and substrate. The first spacer layer, for example, includes a dielectric material such as oxide. Other materials may also be used. The first spacer layer, for example, is formed by depositing a blanket first dielectric layer on the substrate and the gates. The first spacer layer is then patterned to form L-shaped spacers 172. Removal can be achieved, for example, using an anisotropic etch, such as RIE. The thickness of the first spacer elements, for example, is about 300-1000 Å. The process continues to form second spacer elements 174. A second spacer layer is formed over the over the first spacer elements, top of the gates and substrate. The second spacer layer, for example, includes a dielectric material such as nitride. Other materials may also be used. The second spacer layer, for example, is formed by depositing a blanket second spacer layer on the substrate and is then patterned to remove the horizontal portions. Removal can be achieved, for example, using an anisotropic etch, such as RIE. Second spacer elements 174 are formed on the first spacer elements 172 as shown in FIG. 4g. The thickness of the second spacer elements as formed, for example, is about 200-800 Å. Other thicknesses are also useful. As shown, two spacer elements are formed adjacent to each gate sidewall. In other embodiments, it is understood that forming one spacer element on each gate sidewall may also be useful.

In FIG. 4g, first and second heavily doped diffusion regions or source/drain (S/D) regions 162a-162b, 164a-164b, 166a-166b and 168 are formed on the substrate adjacent to the LV, MV, HV and memory gates. In one embodiment, dopants of the opposite type as the type of the well are implanted. In the case of a first type memory cell well, the diffusion regions include a second type. The heavily doped diffusion regions, for example, are formed using techniques such as ion implantation. For illustration, n-type dopants are implanted to form the first and second heavily doped diffusion regions for a p-type memory cell well. For example, n-type dopants, such as P, As, etc., or a combination thereof, are implanted into p-type memory cell well. In one embodiment, the p-type memory cell well 118, for example, is implanted with n-type dopants, such as Arsenic, having a dopant concentration of about $10^{19}$-$10^{20}$ atom/cm$^3$ and to a depth of about few thousand Å from the first substrate surface to form the heavily doped S/D regions 168 which have depths deeper than depths of the LDD region 158 and counter doped regions 128.

The process continues by performing a cleaning process to remove gate dielectric layers over S/D regions and residues over the gates before performing a silicidation process. In one embodiment, the silicidation process forms silicide contacts (not shown) on, for example, exposed portions of the contact regions, such as S/D regions and the gates. The silicide contacts, for example, may be nickel-based silicide contacts. Other types of metal-based silicide contacts, such as titanium or cobalt-based silicide contacts, may also be useful. Due to the overlay margin, the silicide contacts are displaced from the adjacent gates. For example, the silicide contacts are displaced from sides of gates of the split gate by the spacer 174. The displacement from sides of gates should be sufficient to prevent bridging with the gates.

In one embodiment, silicide contacts are formed by depositing a metal layer on the substrate. An anneal is performed to cause a reaction with exposed portions of the S/D regions and the gates. The reaction forms silicide contacts on the exposed portions of these regions. Unreacted metal are selectively removed, leaving the metal-based silicide contacts on the exposed portions of these regions. Removing unreacted metal may be achieved using, for example, a wet etch. Other techniques for removing the unreacted metal may also be useful.

Figure 4H:
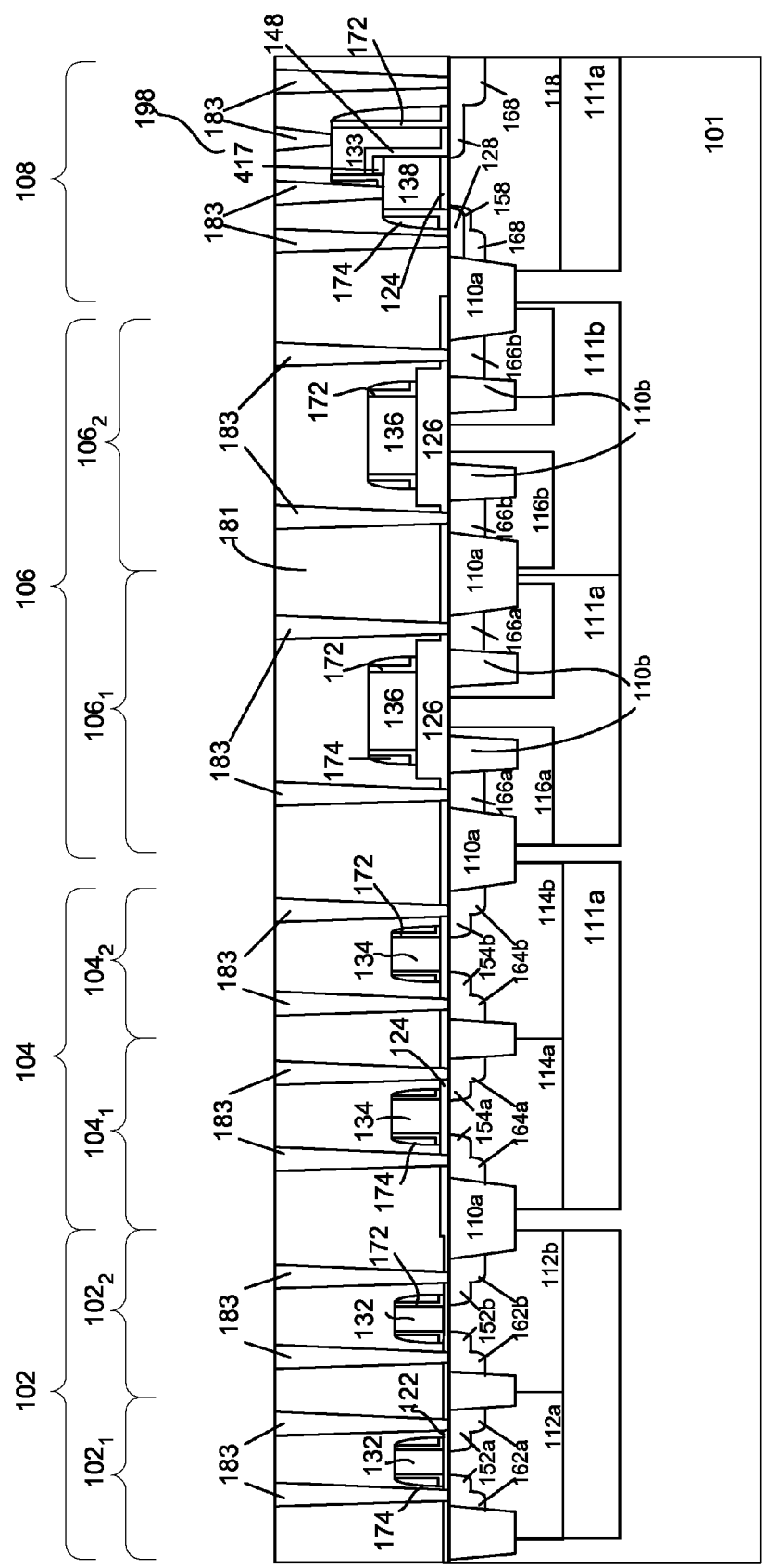

The process continues by forming interconnections to the S/D regions and gates of the transistors. For example, an ILD layer 181 is deposited over the substrate as shown in FIG. 4h and contacts 183 are formed through the ILD layer to form interconnections. Contacts 183 are formed through the ILD layer 181 to the contact regions, such as S/D regions and gates, through mask and etch technique. The ILD layer is patterned to form contact openings and the contact openings are filled with conductive material, such as tungsten, to form the contacts 183. The diffusion regions and gates, for example, are appropriately coupled to SLs, BLs, SGLs and CGLs or WLs. Additional processes are performed to complete the IC. These processes include, for example, final passivation, dicing and packaging.

The process as described in FIGS. 4a-4h enables a memory cell 198 such as that shown in FIG. 1a to be formed. Thus, advantages of the memory cell 198 will not be described or described in detail. Further, the process as described in FIGS.

4a-4h is highly compatible with CMOS logic processing technology. For example, the memory cell 198 can be easily integrated into existing or other logic processing technologies and formed together with LV, MV and HV devices. The process as described offers a simplified and low costs embedded NVM solution. All it requires is the use of additional mask layers to form the memory cell together with other logic devices without the need to purchase new equipment. In addition, the process margin in the memory region is improved due to much smaller memory cell structure, such as 1.5T, relative to conventional 2T cell structure, thus potentially shrinks the cell size further. Further, as described, the process allows a memory cell 198 having asymmetrical S/D regions or junctions to be formed. For example, the drain region of the memory cell includes counter doped region, LDD region and heavily doped drain region while the source region of the memory cell includes counter doped region, heavily doped source region and is devoid of LDD region. By providing counter doped regions, only one mask is required to achieve the asymmetrical S/D regions for the memory cell and allows for optimization of individual Vth for the select gate portion to improve the short channel effect (SCE) and the control gate portion to improve programming efficiency. This offers a simplified solution and reduces the manufacturing costs compared to conventional technique which necessarily uses two separate implant masks to form asymmetrical S/D regions.

Figure 5C:
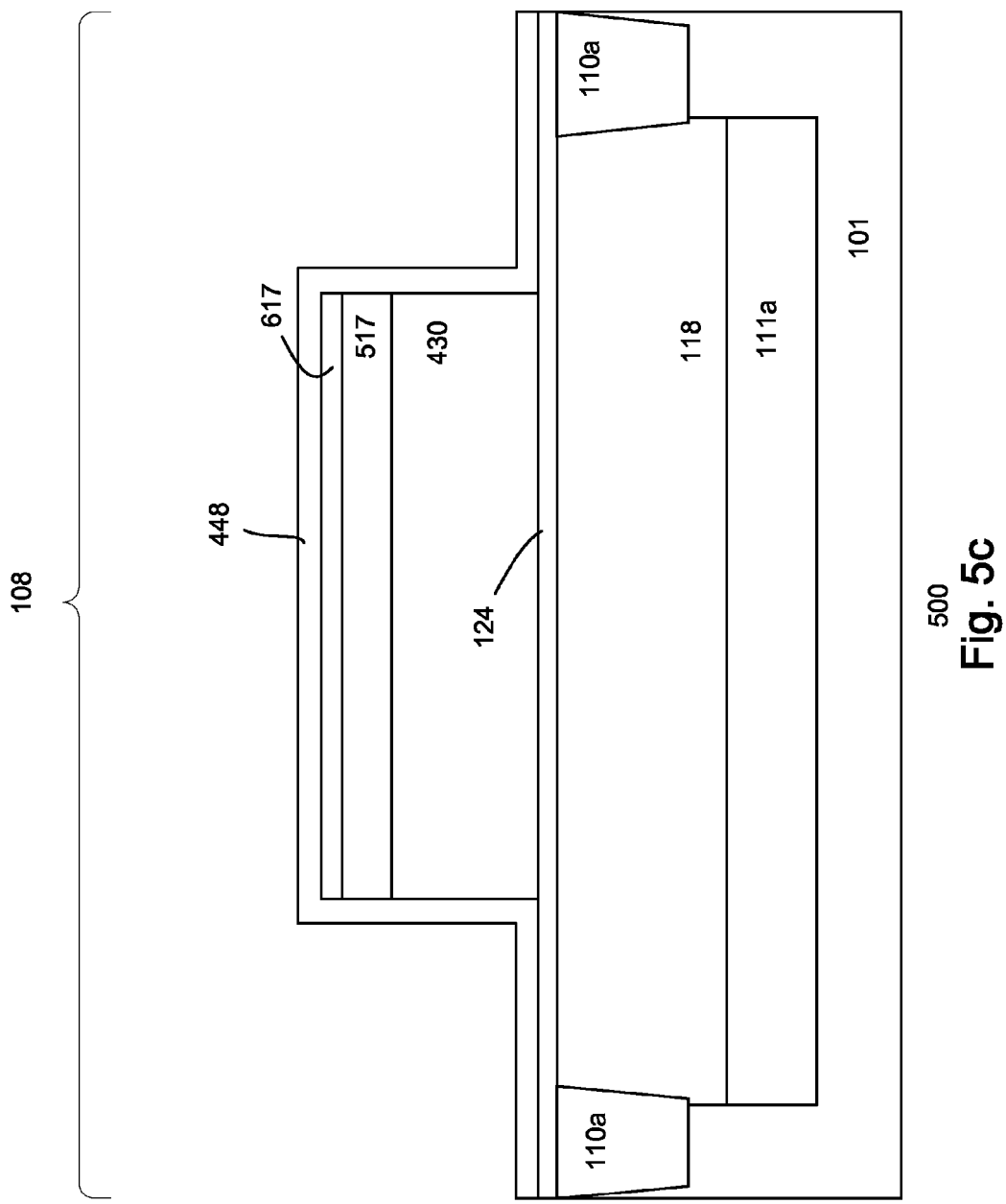

FIGS. 5a-5g show cross-sectional views of another embodiment of a process 500 for forming a portion of a device. In one embodiment, the process 500 forms the portion of the device 200 in the memory cell region 108 as shown in FIG. 2. The process may contain similar steps as that described in FIGS. 4a-4h. In the interest of brevity, common elements having the same reference numerals may not be described or described in detail. Although only the memory cell region 108 is shown, it is understood that the substrate includes other regions as described in FIG. 4a. As shown in FIG. 5a, a partially processed substrate is provided. The partially processed substrate is similar to that described in FIG. 4a. For example, the substrate is processed to form the memory cell well 118, the second gate dielectric layer 124 which is formed simultaneously in the MV region which also serves as the select gate dielectric which will be described later and is processed up to the stage of forming a first gate electrode layer 430 over the substrate.

In one embodiment, the process continues to form a hard mask layer 517 over the substrate and the first gate electrode layer 430. The hard mask layer, in one embodiment, includes a nitride layer. Various suitable techniques, such as CVD, may be used to form the hard mask layer. The thickness of the hard mask layer, for example, is about 30 nm. Other suitable thicknesses may also be useful so long as it is sufficiently thick to serve as an etch stop layer as well as to elevate the height of the control gate such that larger spacer can be formed later to avoid shorting between the select and control gates as will be described later. A soft mask layer (not shown), for example, which includes a photoresist is provided over the hard mask layer. To improve lithographic resolution, an ARC layer 617 may be provided between the mask and hard mask layer. In one embodiment, the ARC layer is a Si-rich ARC layer. Other suitable types of ARC layer may also be useful. Unlike FIG. 4a, the soft mask is patterned to serve as an intermediate gate mask. For example, the mask is patterned to expose portions of the first gate electrode and hard mask layers in the memory cell region to be removed. As such, the exposed portions of the first gate electrode, ARC and hard mask layers which are not protected by the intermediate gate mask over the memory cell region are removed. Removal of the exposed portions can be achieved using, for example, RIE. Other techniques may also be useful. The portion of the first gate electrode, ARC and hard mask layers protected by the mask in the memory cell region remains, forming an intermediate structure as shown in FIG. 5b. Referring to FIG. 5b, the intermediate structure, in one embodiment, includes a width $W_2$ which is at most 2 times the width of a select gate to be formed and a gap between the select gates having a size of at least 2f or more (where f is the minimum technology node feature size). For example, the width of the intermediate structure $W_2$ is equal to about $2 \times W_{SL}' + 2f$ or more, where $W_{SL}'$ is smaller than $W_{SL}$ as described in FIG. 4b which is formed or defined by lithographic technique and f is the minimum technology node feature size. The width $W_2$, for example, is about 300-400 nm. Other suitable width dimensions may also be useful as long as it allows for two memory cells to be formed later without having select and control gates overlay issue.

Referring to FIG. 5c, the process continues to form an isolation layer 448 over the substrate. A second gate electrode layer 433 is then blanket deposited over the isolation layer 448 as shown in FIG. 5d. The isolation layer 448 and the second gate electrode layer 433 as shown in FIGS. 5c-5d, for example, include the same material and are formed by the same technique as that described in FIG. 4c. Thus, details of the materials and techniques for the isolation and second gate electrode layers will not be described. In one embodiment, control gates 233 are formed by anisotropically etching the second gate electrode layer 433. The etch removes horizontal portions of the second gate electrode layer 433 and stops when it reaches the isolation layer 448, leaving spacers to serve as the control gates 233. The etch exposes portions of the isolation layer 448 on the substrate and on top of the intermediate structure. As shown, the control gates are disposed adjacent to the sidewalls of the intermediate structure and do not overlap the intermediate structure.

The process continues to pattern the intermediate structure to define select gate electrodes 138 of first and second memory cells. To define the select gate electrodes of first and second memory cells, a mask 511 is provided on the substrate as shown in FIG. 5e. The mask 511, for example, includes a photoresist. The mask 511, for example, includes an opening having a width $W_{O1}$ which exposes portions of the intermediate structure to be removed. In one embodiment, the width $W_{O1}$ of the mask should be sufficiently wide to form an opening which allows a bordered contact which lands directly on the drain region to be formed therein and sufficiently isolated from adjacent select gates to prevent electrical shorts between adjacent memory cells. For example, the width $W_{O1}$ is at least the size of 2f or more (where f is the minimum technology node feature size). The width $W_{O1}$, for example, is about 150 nm. Other suitable width dimensions may also be useful. The removal process, in one embodiment, includes RIE to remove the exposed portions of the isolation, ARC and hard mask and first gate electrode layers of the intermediate structure. Various etch chemistries may be employed to remove the layers. Other suitable types of removal processes may also be employed. The etch stops when it reaches the gate dielectric layer 124 as shown in FIG. 5f.

Figure 5F:
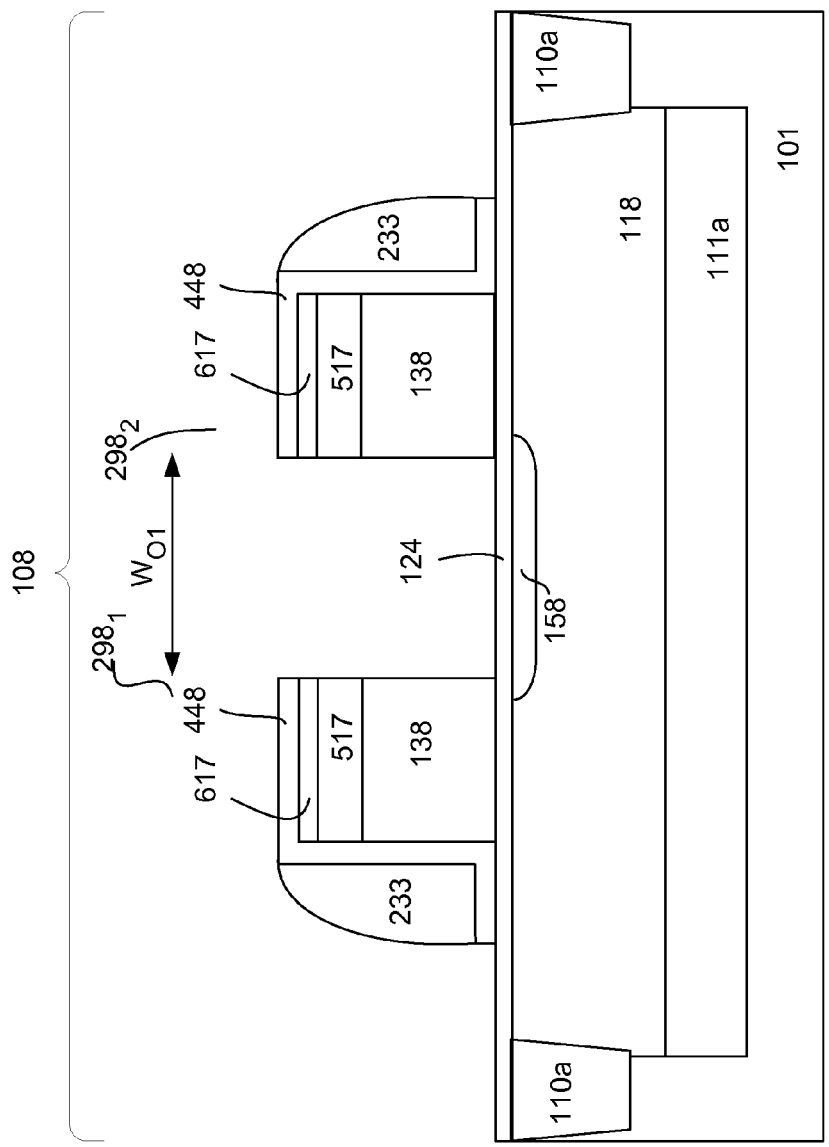

As shown in FIG. 5f, the first and second memory cells $298_1$ and $298_2$ are defined. The process continues to form a shallow and lightly doped drain region 158. A wet clean process may be performed to remove any unwanted residue before forming the lightly doped drain region 158. In one embodiment, dopants of the opposite type as the type of the memory well are implanted. In the case of a first type memory cell well, the lightly doped drain region 158 include a second type. The lightly doped drain region 158, for example, is formed using techniques such as ion implantation which is self-aligned to the gates without using a separate implant mask. For illustration, n-type dopants are implanted to form the shallow drain region 158 for a p-type memory cell well. For example, n-type dopants are implanted into exposed portion of the substrate adjacent to the select gate electrodes 138 between the first and second memory cells. The implantation process employs a low energy and dose to form the shallow drain region 158 identical to the lightly doped drain region 158 as described in FIG. 4f. For example, the exposed portion of the substrate between the first and second memory cells, for example, is implanted with energy of about 30-40 keV with phosphorus dopants having a dopant concentration of about $10^{17}$ atom/cm$^3$ and to a depth of about 3000-4000 Å from the first substrate surface. In some cases, the LDD regions 158 may incorporate low dose of boron (B) as halo implant to suppress short channel effect. As shown in FIG. 5f, the shallow drain region 158 is a common drain region for the first and second memory cells. The mask 511 is removed after forming the shallow drain region 158.

Figure 5G:
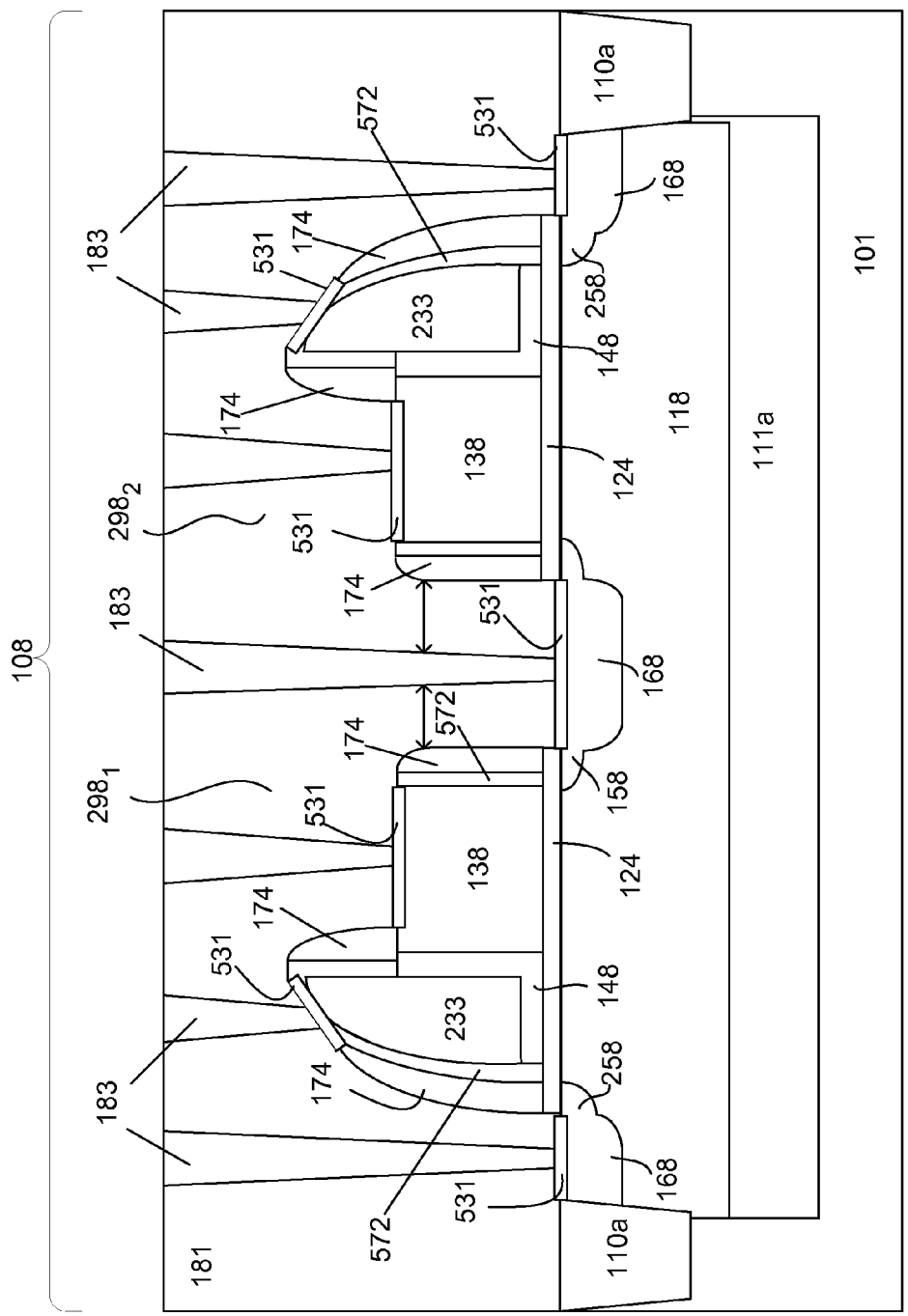

The process continues to remove horizontal portions of the isolation layer 448 over the ARC layer 617, the ARC layer 617 and the hard mask 517 as shown in FIG. 5g. The removal of these layers can be achieved using, for example, RIE. Other suitable techniques may also be employed to remove these layers. The etch stops until it exposes top surface of the select gate electrodes 138 as shown in FIG. 5g. Sidewall oxides 572 are selectively grown on the select and control gates 138 and 233 after the RIE process. The sidewall oxides 572, for example, include an oxide. The oxide is formed using high temperature wet oxidation to repair plasma damage caused by the RIE process. The high temperature wet oxidation may be performed, for example, at 900° C. Other temperature may also be useful. The thickness of the sidewall oxides 572 is about 200 Å. Other thickness ranges may also be useful.

The process continues to form LDD regions 258 in the substrate adjacent to the control gate of the memory cell in the memory cell region 108. In one embodiment, dopants of the opposite type as the type of the memory cell well are implanted. In the case of a first type memory cell well 118, the LDD regions 258 includes a second type. The LDD regions 258, for example, are formed using techniques such as ion implantation and an implant mask (not shown) which exposes only the substrate region adjacent to the control gates. For example, n-type dopants, such as phosphorus and boron, are implanted into p-type memory cell well. The LDD region 258, for example, is formed by implanting second type dopants with energy of about 50-60 keV having a dopant concentration of about $10^{17}$ atom/cm$^3$ from the first substrate surface. Other suitable concentrations or depth dimensions may also be useful. As shown, the LDD region 258 is deeper than the shallow drain region 158.

First and second heavily doped diffusion or S/D regions 168 are also formed in the substrate adjacent to the memory gates. The techniques and parameters for forming the heavily doped S/D regions 168 are the same as that described in FIG. 4g. Thus, these techniques and parameters will not be described.

The process may continue to complete forming the device. For example, the process continues to define the LV, MV and HV gates in the logic region, which is the same as that described in FIG. 4f. Further, the process continues until a portion of the device shown in FIG. 5g is formed. For instance, the process continues to form first and second sidewall spacers 172 (not shown) and 174, silicide contacts 531, ILD layer 181, contacts 183 etc. Techniques and materials of these features are the same as that already described in FIGS. 4g-4h. Additional processes may be performed, including forming LDD and S/D regions of the logic devices, forming one or more interconnect levels, final passivation, dicing, assembly and packaging.

The process as described in FIGS. 5a-5g enables a memory cell 200 such as that shown in FIG. 2 to be formed. Thus, advantages of the memory cell 200 will not be described or described in detail. The process as described in FIGS. 5a-5g also offers similar or the same advantages as the process as described in FIGS. 4a-4h. Furthermore, as described, the control gate 233 is a control gate spacer formed by RIE spacer process which does not require an etch mask or high selective etch. As shown, the process described above only forms a control gate spacer 233 on one side of a select gate. This is in contrast to conventional process where control gates will be formed on both sides of a select gate and an expensive lithography mask is necessarily required to remove the control spacers over the drain region prior to forming the drain region. Thus, the process as described in FIGS. 5a-5g eliminates the need of an expensive lithography mask and offers a cost saving solution. Moreover, since the memory cell 298 includes control gate spacer, the memory cell can be shrunk further. In addition, the process allows for a memory cell 298 having asymmetrical S/D regions to be formed with the use of a single mask. For example, the process enables a shallow self-aligned drain region 158 which does not require an additional or separate implant mask to be formed; and the single implant mask which exposes the source region while covering the drain region allows lightly doped source regions 258 which are formed by different dose and energy than that of shallow drain region 158 to be achieved. The shallow drain region 158 is advantageous as it allows smaller gates to be formed while suppressing short channel effect and the deeper source region that usually comes with higher source junction breakdown is highly desirable for programming. Thus, this process produces smaller memory cell, optimizes the device performance and reduces manufacturing costs at the same time.

Figure 6B:
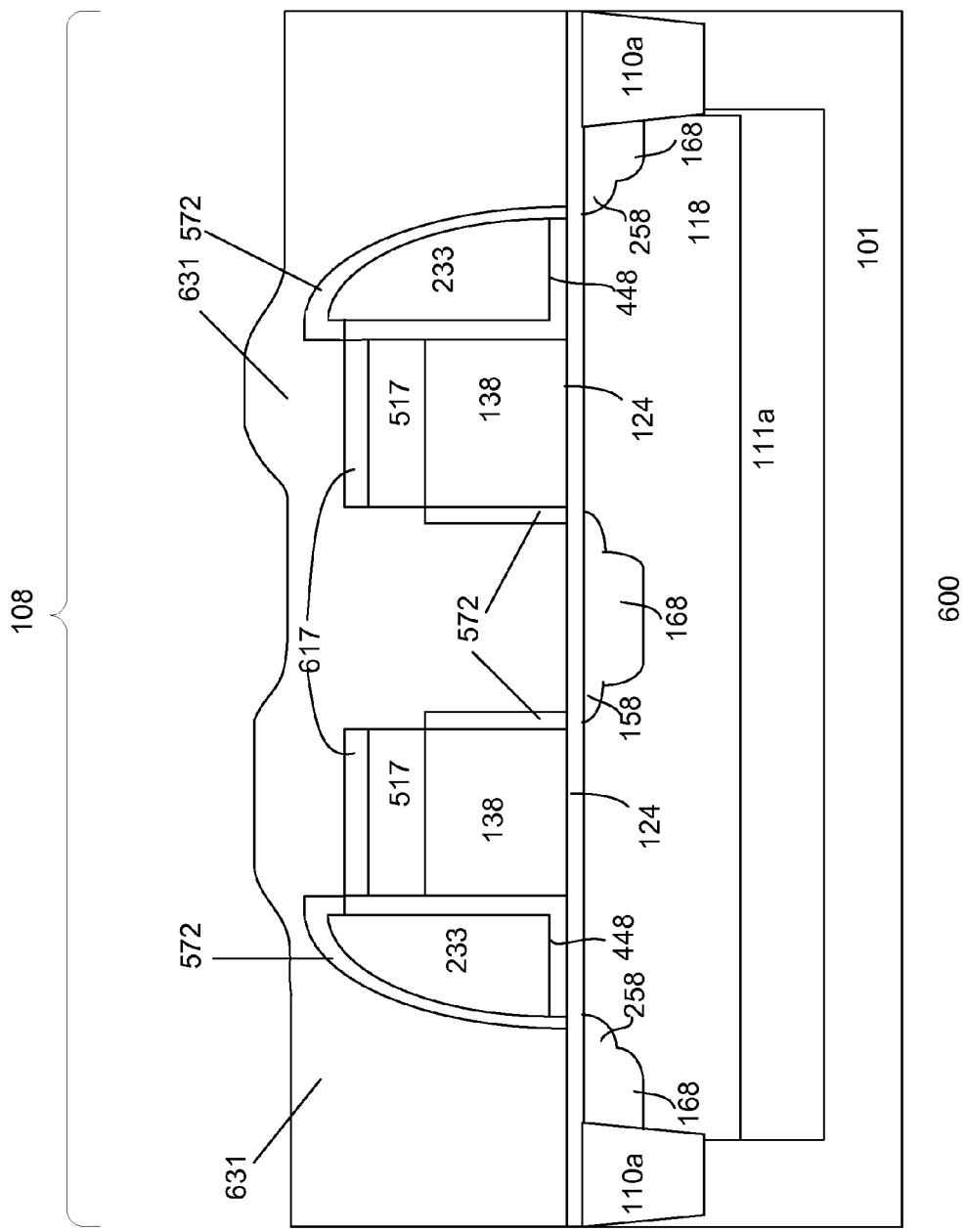

FIGS. 6a-6f show cross-sectional views of another embodiment of a process 600 for forming a portion of a device. In one embodiment, the process 600 forms the portion of the device 300 in the memory cell region 108 of the device as shown in FIG. 3. The process may contain similar steps as that described in FIGS. 4a-4h and FIGS. 5a-5g. Further, the process as will be described below allows the memory cell to shrink further. In the interest of brevity, common elements having the same reference numerals may not be described or described in detail. Although only the memory cell region 108 is shown, it is understood that the substrate includes other regions as described in FIG. 4a. As shown in FIG. 6a, a partially processed substrate is provided. The partially processed substrate is similar to that described in FIG. 5d. For example, the substrate is processed to form the memory cell well 118, the second gate dielectric layer 124 which is formed simultaneously in the MV region which also serves as the select gate dielectric which will be described later and is processed up to the stage of forming the control gates 233 as described in FIG. 5d.

In this embodiment, the intermediate structure includes a width $W_3$ which is at least 2 times the width of a select gate $W_{SL}'$ as defined above to be formed and a gap between the select gates having a size of less than 2f (where f is the minimum technology node feature size). Thus, the width of the intermediate structure $W_3$ in this embodiment is smaller than the width of the intermediate structure $W_2$ described in FIG. 5b. In one embodiment, the process continues to pattern the intermediate structure to define select gate electrodes 138 of first and second memory cells. To define the select gate electrodes of first and second memory cells, a mask 611 is provided on the substrate as shown in FIG. 6a. The mask 611, for example, includes a photoresist. The mask 611, for example, includes an opening having a width $W_{O2}$ which exposes portions of the intermediate structure to be removed. In one embodiment, the width $W_{O2}$ of the mask 611 is smaller than the width $W_{O1}$ of the mask 511 as described in FIG. 5e. In one embodiment, the width $W_{O2}$ of the mask 611 is less than the size of 2f (where f is the minimum technology node feature size). The width $W_{O2}$, for example, is about 1.2 to 1.5f. The width $W_{O2}$, for example, is about 80 nm. Other suitable width dimensions may also be useful. A removal process, in one embodiment, which includes RIE is used to remove the exposed portions of the isolation, ARC and hard mask and first gate electrode layers of the intermediate structure. Various etch chemistries may be employed to remove the layers. Other suitable types of removal processes may also be employed. The etch stops when it reaches the gate dielectric layer 124 as shown in FIG. 6a.

As shown in FIG. 6a, the first and second memory cells 398$_1$ and 398$_2$ are defined. The process continues to form a shallow drain region 158. The shallow drain region 158 is formed using the same dopants and technique as that described in FIG. 5f. In one embodiment, the drain region is self-aligned to the gates and is a shallow drain region. Thus, in this embodiment, the width of drain region is further reduced as the spacing between adjacent select gates is reduced. As shown, the shallow drain region 158 is a common drain region for the first and second memory cells.

The process continues to remove horizontal portions of the isolation layer 448 over the ARC layer 617. The removal of the horizontal portion of the isolation layer 448 over the ARC layer 617 can be achieved using, for example, RIE. Other suitable techniques may also be employed to remove this portion. The etch stops until it exposes top surface of the ARC layer 617 as shown in FIG. 6b. Sidewall oxides 572 are selectively grown on the select and control gates 138 and 233. Heavily doped diffusion regions 168 are formed adjacent to the control gates 233. The material, dopants and techniques for forming the sidewall oxides 572 and heavily doped diffusion regions 168 are the same as that described in FIG. 5g.

Referring to FIG. 6b, the process continues to form an insulator layer 631 over the substrate. The insulator layer, for example, is a conformal layer which is deposited over the substrate. In one embodiment, the insulator layer includes an ozone-TEOS layer or HARP oxide. Other suitable insulator material which can completely fill the gap between adjacent select gates and does not cause plasma damage may also be used.

A mask (not shown) is provided over the substrate. The mask includes an opening which exposes the memory cell region 108 while covering the logic and peripheral region. In one embodiment, the process continues by anisotropically etching the insulator layer 631. The etch removes horizontal portions of the insulator layer 531, leaving vertical portions of the insulator layer 631 disposed over the first spacer elements 572 adjacent to the select gates 130 to serve as insulator liners 631 and to define the location of which a contact plug is to be formed later. The etch also removes portions of the gate dielectric layer 124 over the drain region and source regions.

Figure 6C:
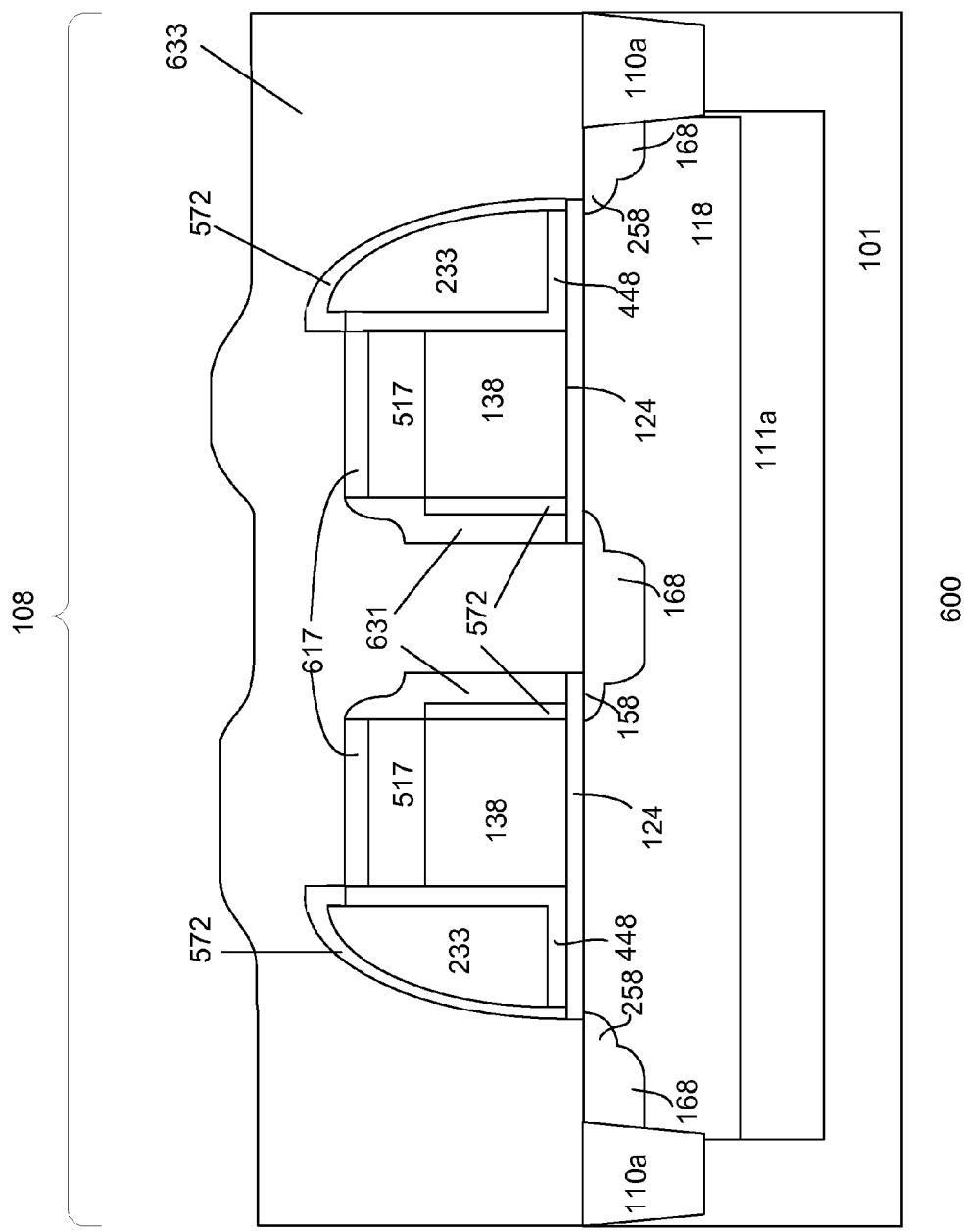

Referring to FIG. 6c, the process continues to form a dummy layer 633 over the substrate and fills the space between the insulator liners above the drain region. The dummy layer, for example, includes a blanket dummy layer. In one embodiment, the dummy layer includes polysilicon. The dummy layer can be formed by CVD. Other suitable materials and techniques may be used for the dummy layer. The thickness of the dummy layer is, for example, about 100 Å. Other thickness ranges may also be useful.

Figure 6D:
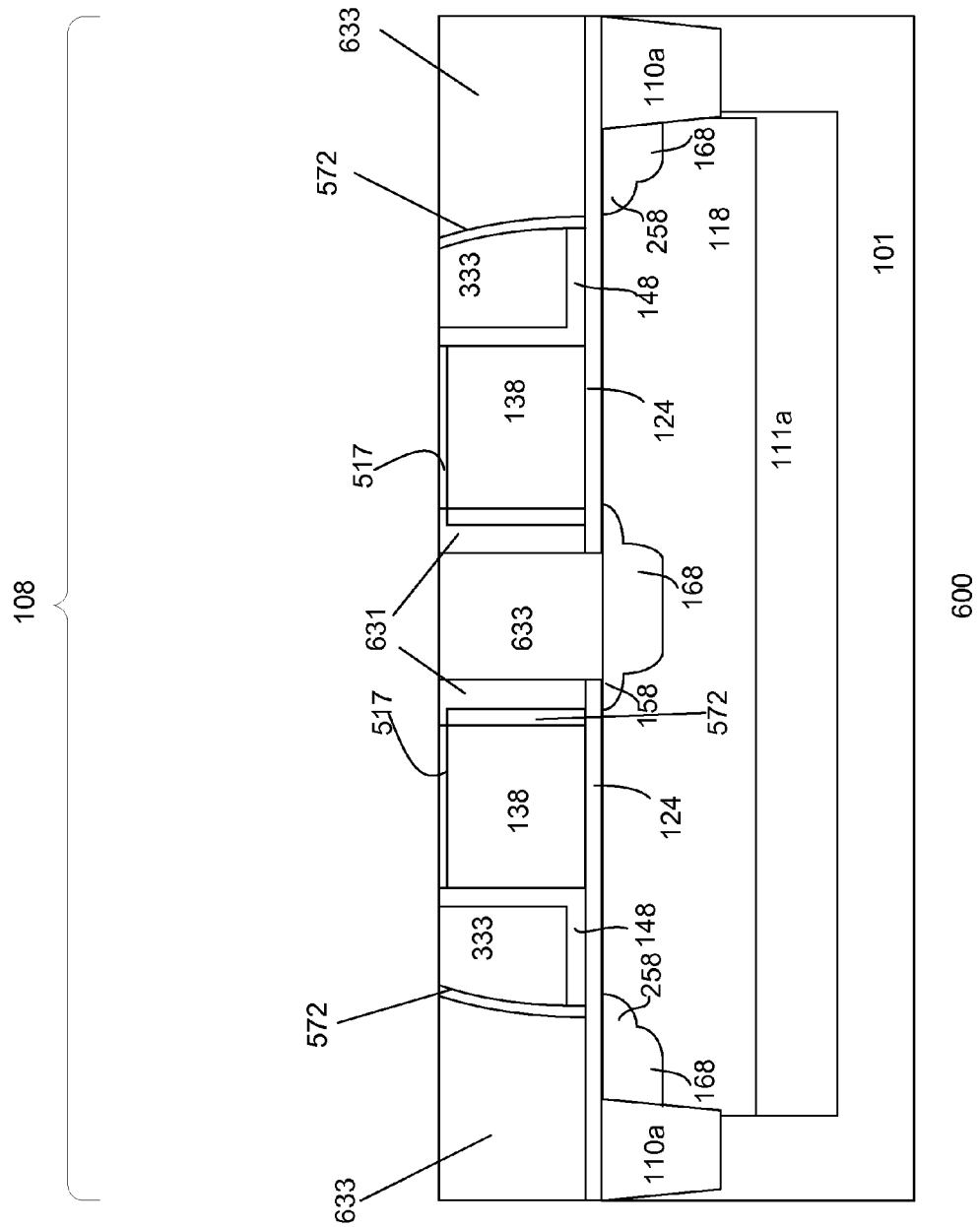

A planarization process is performed on the substrate such that the top surface of the various layers are substantially planar or flat as shown in FIG. 6d. For example, a chemical mechanical polishing (CMP) process may be employed. Other types of planarization processes may also be useful. In one embodiment, the planarization process stops when it reaches top surface of the hard mask layer 517. An over polishing process may be performed to thin the hard mask layer. For example, the hard mask layer is reduced to about 5 nm thick. Other suitable thickness dimension may also be useful. As shown in FIG. 6d, the remaining dummy layer between the insulator liners 631 is directly over and coupled to the drain region, forming a contact plug 633. Thus, the contact plug 633 is self-aligned and made borderless to the drain region without requiring critical lithography process to define the contact plug.

Referring to FIG. 6e, the process continues by providing a mask layer (not shown). The mask layer, for example, includes openings which expose the logic and peripheral region and source regions of the memory cell region 108 which are adjacent to the control gates while covering portions of the memory cell region over the drain region which are adjacent to the select gates. In one embodiment, the process continues to remove the remaining dummy layer 633 over the source regions. In one embodiment, the dummy layer 633 over the source regions is removed by, for example, a RIE process. Other suitable techniques may also be employed to remove the dummy layer 633 over these regions. As shown, the contact plug 633 is protected by the mask layer and remains over the drain region.

Figure 6F:
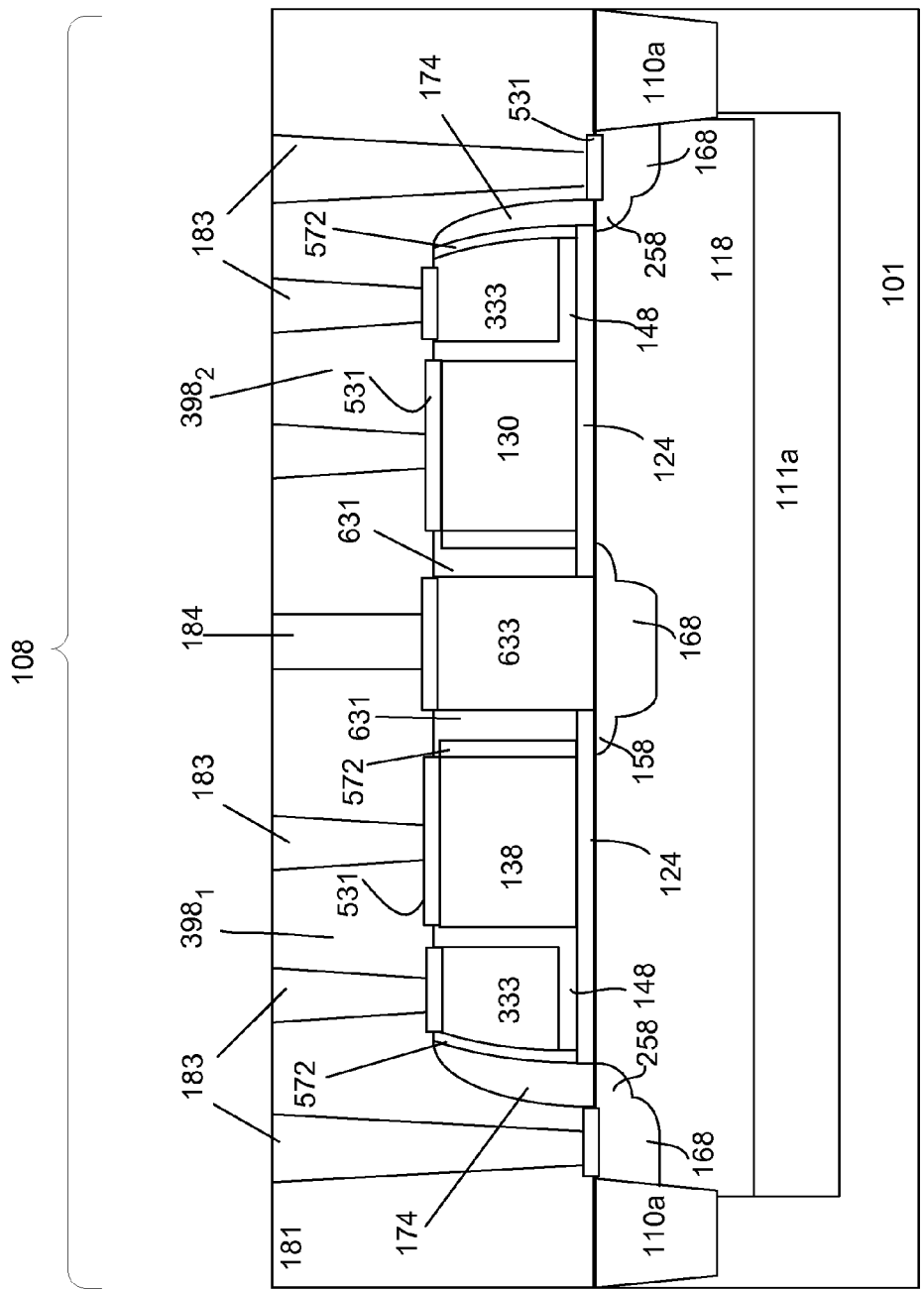

The process may continue to complete forming the device. For example, the process continues to define the LV, MV and HV gates in the logic and peripheral region, which is the same as that described in FIG. 4f. Further, the process continues until a portion of the device shown in FIG. 6f is formed. For instance, the process continues to form first and second sidewall spacers 172 (not shown) and 174, silicide contacts 531, ILD layer 181, contacts 183 and 184, etc. Techniques and materials of these features are the same as that already described in FIGS. 4g-4h. Prior to the silicidation process, the remaining hard mask 517 over the select gates is removed using suitable technique. In one embodiment, the contact 184 over the drain region is indirectly coupled to the drain region through the contact plug 633. The contact 184 is formed by the same technique used to form contacts 183. Additional processes may be performed, including forming LDD and S/D regions of the logic devices, forming one or more interconnect levels, final passivation, dicing, assembly and packaging.

The process as described in FIGS. 6a-6f enables a memory cell 398 such as that shown in FIG. 3 to be formed. Thus, advantages of the memory cell 398 will not be described or described in detail. The process as described in FIGS. 6a-6f also offers similar or the same advantages as the process as described in FIGS. 4a-4h or FIGS. 5a-5g. Furthermore, the process as described above enables a self-aligned and borderless dummy contact plug to be formed and directly coupled to the drain region without requiring critical lithography process. As a result, the embodiment as described with respect to FIGS. 6a-6f removes the limitation faced by critical lithography which requires the patterned photoresist mask having at least 2 times the minimum technology feature size in order to define the contact to the drain region, such as that shown in FIG. 2. Since self-aligned contact plug can be formed between the adjacent select gates, the space between the adjacent select gates can be reduced further, resulting in even smaller drain region and memory cell to be formed. In addition, the insulator liners 631 also avoid shorting between the contact plug with adjacent select gates, thereby increasing reliability of the memory cell.

The invention may be embodied in other specific forms without departing from the spirit or essential characteristics thereof. The foregoing embodiments, therefore, are to be considered in all respects illustrative rather than limiting the invention described herein. Scope of the invention is thus indicated by the appended claims, rather than by the foregoing description, and all changes that come within the meaning and range of equivalency of the claims are intended to be embraced therein.

What is claimed is:

1. A method for forming a semiconductor device comprising:
    providing a substrate prepared with a memory cell region;
    forming a first gate structure on the memory cell region;
    forming an isolation layer on the substrate and over the first gate structure;
    forming a second gate structure, wherein the second gate structure is adjacent to and separated from the first gate structure by the isolation layer;
    processing the first and second gate structures to form at least one split gate structure with first and second adjacent gates; and
    providing asymmetrical source and drain regions adjacent to first and second sides of the split gate structure, wherein providing the asymmetrical source and drain regions comprises
        forming at least one first lightly doped region in a region of the substrate adjacent to the first side of the split gate structure, and
        forming at least one second lightly doped region in a region of the substrate adjacent to the second side of the split gate structure, wherein the first and second lightly doped regions are formed at different depths from a top surface of the substrate.

2. The method of claim 1 wherein:
    the substrate comprises silicon;
    the first gate comprises a select gate;
    the second gate comprises a control gate; and
    the isolation layer comprises an oxide-nitride-oxide (ONO) stack to form a split gate SONOS memory cell.

3. The method of claim 1 wherein:
    forming the at least one first lightly doped region comprises forming at least one lightly doped drain region in the region of the substrate adjacent to the first gate; and
    forming the at least one second lightly doped region comprises forming at least one counter doped region in the region of the substrate adjacent to the second gate, wherein the lightly doped drain region comprises a depth deeper than the counter doped region from the top surface of the substrate.

4. A method for forming a semiconductor device comprising:
    providing a substrate prepared with a memory cell region;
    forming a first gate structure on the memory cell region;
    providing a hard mask over the first gate structure prior to forming the isolation layer;
    forming an isolation layer on the substrate and over the first gate structure;
    forming a second gate structure, wherein the second gate structure is adjacent to and separated from the first gate structure by the isolation layer;
    processing the first and second gate structures to form at least one split gate structure with first and second adjacent gates; and
    providing asymmetrical source and drain regions adjacent to first and second sides of the split gate structure, wherein providing the asymmetrical source and drain regions comprises
        forming counter doped regions into regions of the substrate adjacent to the sides of the patterned first gate with blanket implantation with no added lithographic mask;
        providing an implant mask to cover the region of the substrate adjacent to the second gate and performing an implant to form lightly doped diffusion (LDD) region adjacent to the first gate; and
        forming heavily doped regions into regions of the substrate adjacent to sides of the split gate structure, wherein the heavily doped region includes a depth deeper than the counter doped regions and LDD region.

5. The method of claim 1 comprising:
    providing a hard mask over the first gate structure prior to forming the isolation layer; and
    wherein processing the second gate structure forms the second gate having a first portion which partially overlaps a portion of the first gate and a second portion over the substrate.

6. The method of claim 5 wherein a portion of the hard mask layer over the first gate structure is removed while a portion of the hard mask under the portion of the second gate overlapping the first gate remains after processing the second gate structure.

7. The method of claim 1 comprising:
    providing a hard mask over the first gate structure prior to forming the isolation layer; and
    forming an anti-reflective coating (ARC) layer over the hard mask layer, wherein the first gate structure, the hard mask and the ARC layers form an intermediate structure.

8. The method of claim 7 wherein processing the first and second gate structures comprises anisotropically etching the second gate structure, wherein the etch removes horizontal portions of the second gate structures to form second gate spacers over first and second sides of the intermediate structure.

9. The method of claim 8 wherein processing the first and second gate structures comprises:
    providing a mask having an opening with a width of at least 2f or more over the substrate, wherein f is the minimum technology node feature size; and
    patterning the intermediate structure to form at least first and second split gate structures, wherein each of the split gate structure comprises first gate and second gate spacer adjacent to the first gate while leaving a gap having a width of at least 2f or more between the first and second split gate structures.

10. The method of claim 9 wherein:
    forming the at least one first lightly doped region comprises forming a lightly doped drain region in a region of the substrate between first and second split gate structures, wherein the lightly doped drain region is formed by an implantation which is self-aligned to the split gate structures without using an implant mask; and
    forming the at least one second lightly doped region comprises forming lightly doped regions into regions of the substrate adjacent to sides of the second gate spacers of the split gate structure, wherein the lightly doped regions are formed by an implantation which employs an implant mask and with higher dose and energy compared to that of the lightly doped drain region.

11. The method of claim 10 comprises removing the ARC and hard mask layer after providing the asymmetrical source and drain regions, wherein the first and second gates of the split gate structure comprise non-coplanar top surfaces.

12. The method of claim 8 wherein processing the first and second gate structures comprises:
providing a mask having an opening with a width of less than 2f over the substrate, wherein f is the minimum technology node feature size; and
patterning the intermediate structure to form at least first and second split gate structures, wherein each of the split gate structure comprises first gate and second gate spacer adjacent to the first gate while leaving a gap having a width of less than 2f between the first and second split gate structures.

13. The method of claim 12 wherein:
forming the at least one first lightly doped region comprises forming a lightly doped drain region in a region of the substrate between first and second split gate structures, wherein the lightly doped drain region is formed by an implantation which is self-aligned to the split gate structures without using an implant mask; and
forming the at least one second lightly doped region comprises forming lightly doped regions into regions of the substrate adjacent to sides of the second gate spacers of the split gate structure, wherein the lightly doped regions are formed by an implantation which employs an implant mask and with higher dose and energy compared to that of the lightly doped drain region.

14. The method of claim 13 comprising:
providing an insulator layer over the substrate, wherein the insulator layer completely fills the gap between the first and second split gate structures; and
anisotropically etching the insulator layer, leaving vertical portions of the insulator layer as insulator liners disposed over sides of the first gates of the split gate structures adjacent to the drain region.

15. The method of claim 14 comprising forming a borderless contact plug over the drain region, wherein the borderless contact plug is formed by:
providing a dummy layer over the substrate and fills the space between the insulator liners over the drain region; and
performing a planarization process such that top surfaces of the first and second gates and the contact plug are substantially coplanar with each other.

16. The method of 15 wherein the planarization process stops when it reaches top surface of the hard mask layer.

17. The method of claim 16 comprising:
providing a mask layer which includes openings exposing the source regions of the split gate structures while covering portion of the split gate structures over the drain region which are adjacent to the first gates; and
removing remaining dummy layer over the source regions.

18. The method of claim 17 comprising removing remaining hard mask layer over the first gates.

19. The method of claim 18 comprising:
forming first type contacts which are coupled to source regions of the split gate structures; and
forming second type contact which is coupled to the borderless contact plug over the drain region.

20. The method of claim 1 wherein:
the first gate comprises a select gate;
the second gate comprises a control gate;
the drain region is formed adjacent to the select gate and the source region is formed adjacent to the control gate; and comprising
coupling the drain region to a bit line (BL), the source region to a source line (SL), and coupling the select gate to a select gate line (SGL) and the control gate to a control gate line (CGL) together forming a word line, resulting in standard sensing configuration in NOR architecture with common source within a sector and different source bias across sectors.

21. The method of claim 1 wherein:
the first gate comprises a select gate;
the second gate comprises a control gate;
the source region is formed adjacent to the select gate and the drain region is formed adjacent to the control gate; and comprising
coupling the source region to a source line (SL), the drain region to a bit line (BL), and coupling the select gate to a select gate line (SGL) and the control gate to a control gate line (CGL) together forming a word line, resulting in standard sensing configuration in NOR architecture with common source.

* * * * *